(12) United States Patent
Lee et al.

(10) Patent No.: US 12,057,392 B2
(45) Date of Patent: Aug. 6, 2024

(54) CONDUCTIVE FEATURES HAVING VARYING RESISTANCE

(71) Applicant: Taiwan Semiconductor Manufacturing Co., Ltd., Hsinchu (TW)

(72) Inventors: Jia-En Lee, Hsinchu (TW); Po-Yu Huang, Hsinchu (TW); Shih-Che Lin, Hsinchu (TW); Chao-Hsun Wang, Chung-Li (TW); Kuo-Yi Chao, Hsinchu (TW); Mei-Yun Wang, Chu-Pei (TW); Feng-Yu Chang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 17/648,138

(22) Filed: Jan. 17, 2022

(65) Prior Publication Data
US 2022/0139828 A1    May 5, 2022

Related U.S. Application Data

(62) Division of application No. 16/532,218, filed on Aug. 5, 2019, now Pat. No. 11,227,830.
(Continued)

(51) Int. Cl.
*H01L 23/522* (2006.01)
*H01L 21/3115* (2006.01)
(Continued)

(52) U.S. Cl.
CPC .... *H01L 23/5228* (2013.01); *H01L 21/31155* (2013.01); *H01L 21/76802* (2013.01);
(Continued)

(58) Field of Classification Search
CPC .......... H01L 23/5228; H01L 21/31155; H01L 21/76825; H01L 21/76877;
(Continued)

(56) References Cited

U.S. PATENT DOCUMENTS 6,514,844 B1    2/2003  Martin et al.
6,998,343 B1    2/2006  Sun et al.
(Continued)

*Primary Examiner* — Bac H Au
(74) *Attorney, Agent, or Firm* — Slater Matsil, LLP

(57) ABSTRACT

Methods to form vertically conducting and laterally conducting low-cost resistor structures utilizing dual-resistivity conductive materials are provided. The dual-resistivity conductive materials are deposited in openings in a dielectric layer using a single deposition process step. A high-resistivity β-phase of tungsten is stabilized by pre-treating portions of the dielectric material with impurities. The portions of the dielectric material in which impurities are incorporated encompass regions laterally adjacent to where high-resistivity β-W is desired. During a subsequent tungsten deposition step the impurities may out-diffuse and get incorporated in the tungsten, thereby stabilizing the metal in the high-resistivity β-W phase. The β-W converts to a low-resistivity α-phase of tungsten in the regions not pre-treated with impurities.

20 Claims, 19 Drawing Sheets

Related U.S. Application Data

(60) Provisional application No. 62/753,691, filed on Oct. 31, 2018.

(51) Int. Cl.
*H01L 21/768* (2006.01)
*H01L 23/528* (2006.01)
*H01L 23/532* (2006.01)
*H01L 49/02* (2006.01)

(52) U.S. Cl.
CPC .. *H01L 21/76825* (2013.01); *H01L 21/76877* (2013.01); *H01L 23/528* (2013.01); *H01L 23/53257* (2013.01); *H01L 28/24* (2013.01)

(58) Field of Classification Search
CPC ......... H01L 21/76879; H01L 21/76805; H01L 21/76897; H01L 21/823475
See application file for complete search history.

(56) References Cited

U.S. PATENT DOCUMENTS

| | | | |
|---|---|---|---|
| 2013/0062732 A1* | 3/2013 | Lin | H01L 21/76801 257/532 |
| 2013/0207221 A1 | 8/2013 | McMullan et al. | |
| 2017/0125509 A1 | 5/2017 | Ferrer Luppi et al. | |
| 2019/0157148 A1* | 5/2019 | Hsieh | H01L 27/0886 |
| 2019/0305107 A1* | 10/2019 | Chen | H01L 29/785 |
| 2021/0391255 A1* | 12/2021 | Chen | H01L 21/76846 |

\* cited by examiner

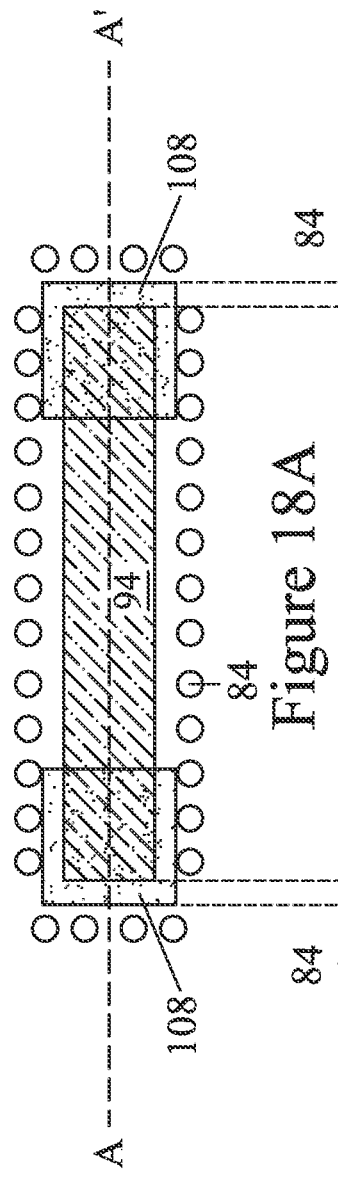
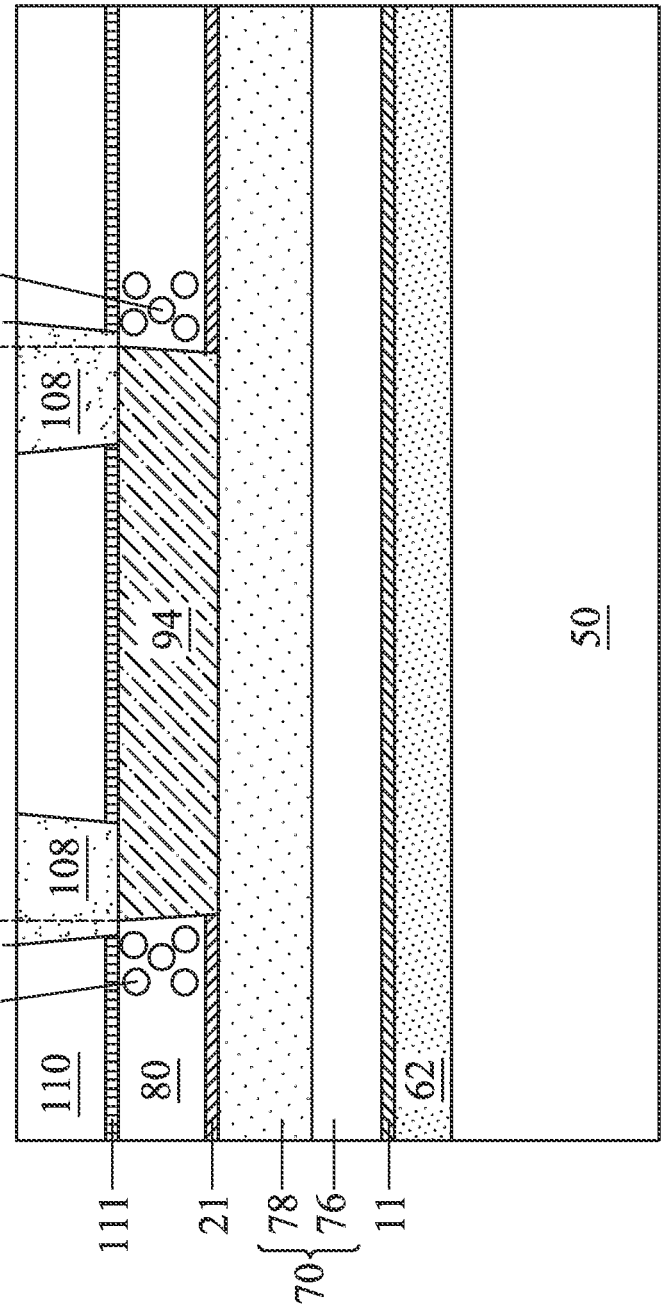
Figure 18A
Figure 18B

CONDUCTIVE FEATURES HAVING VARYING RESISTANCE

PRIORITY CLAIM AND CROSS-REFERENCE

This application is a divisional of U.S. patent application Ser. No. 16/532,218, filed on Aug. 5, 2019, and entitled "Conductive Features Having Varying Resistance," which claims the benefit of U.S. Provisional Patent Application No. 62/753,691, filed on Oct. 31, 2018, and entitled "Contacts Having Varying Resistance," each application is hereby incorporated by reference.

BACKGROUND

The semiconductor industry continues to increase the density of electronic components (e.g., transistors, diodes, resistors, capacitors, etc.) and interconnect features (e.g., contacts, vias, lines, bond pads etc.) in integrated circuits (ICs) by innovations in semiconductor technology such as, multiple patterning to reduce the minimum size of features (e.g., lines, spaces, and holes), three-dimensional (3D) transistors (e.g., the fin field-effect transistor (FinFET)), and more interconnect levels. Yet another method of increasing component density is embedding electronic components within the interconnect system stacked above the semiconductor substrate. Many of these innovations increase the performance and functionality of integrated circuits, but at the expense of higher processing complexity and processing cost. The increased cost per wafer presents new challenges in maintaining the exponential growth of the IC market that is fueled by lowering the cost per function without compromising the performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A through 19B illustrate cross-sectional views and planar schematics of laterally conducting resistor structures formed in an interlayer dielectric layer of an interconnect system, at an intermediate stage of fabrication, in accordance with some embodiments.

DETAILED DESCRIPTION

Figure 1:
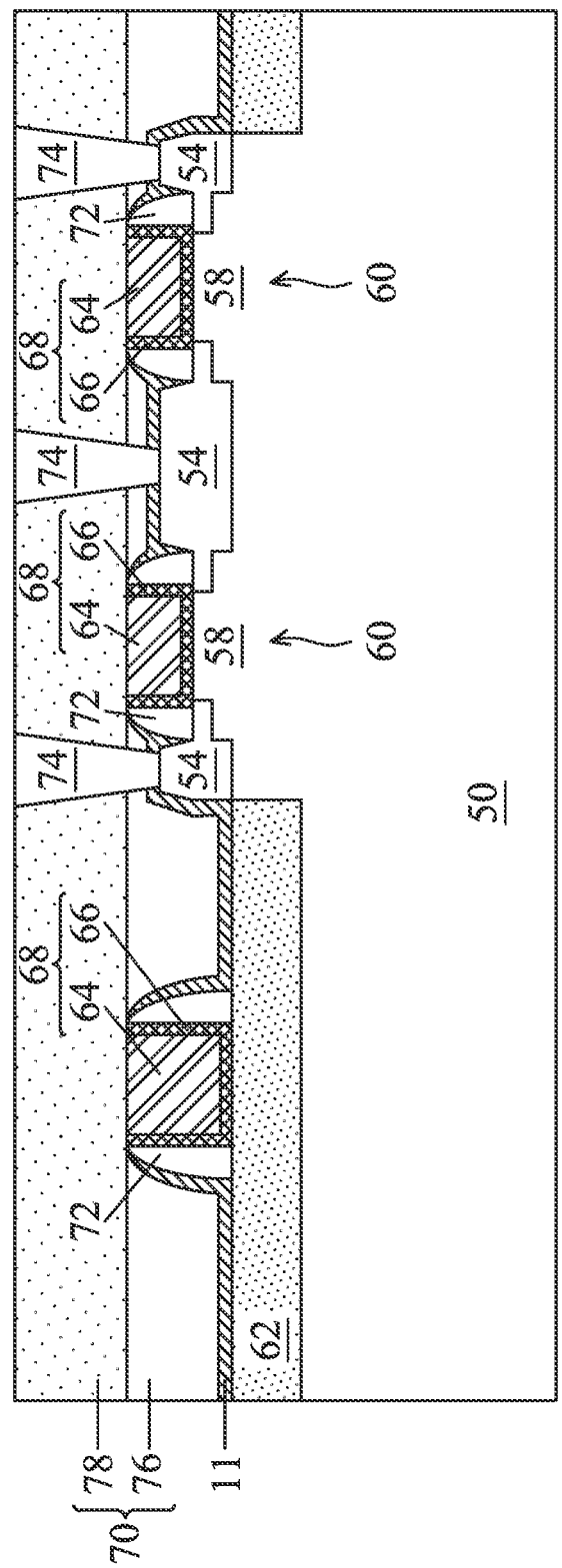
FIGS. 1 through 9 illustrate cross-sectional views of various intermediate stages in formation of contacts having different resistances, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes embodiments of conductive structures comprising a high-resistivity phase of the conductive material or a low-resistivity phase of the conductive material. In some embodiments, methods described herein may be utilized such that both types of structures are formed simultaneously using the same deposition processing steps. The phase of the conductive material may be controlled by a pre-treatment process performed prior to depositing the conductive material, wherein the pre-treatment process reduces the phase change in the conductive material, leaving the conductive material in a high-resistivity phase.

In some embodiments, the methods for simultaneously forming dual-resistivity phases of a conductive material may be applied to form contacts with substantially different electrical resistances ($R_e$). This application is illustrated in this disclosure in the context of contacts through which electrical current may flow vertically between the source/drain electrodes of FinFETs (fin-shaped 3D metal-oxide-semiconductor field-effect transistors (MOSFETs)) and metal-1 ($M_1$) lines. In general, a contact refers to a conductive path comprising one or more vertical conductive features that physically and electrically connect an electrode of an electronic device formed in a semiconductor substrate to a conductive element of an interconnect structure above the contacts. The vertical conductive features of the example contact are inlaid in the insulating layers, referred to as interlayer dielectric (ILD) layers and interposed between the FinFET and the $M_1$ line. A contact having a high $R_c$ may be used as a resistor component connected in series with the respective electrode, whereas a contact with a low $R_c$ may be used to directly connect the electrode to other electronic devices, power supplies, or signal lines via the multilevel interconnect system of the integrated circuit, as specified by a circuit design.

While aspects of methods of forming dual-resistivity conductive materials simultaneously are discussed in the context of contacts connecting source/drain electrodes of FinFET devices to $M_1$-lines of an example multilevel interconnect system, other embodiments may utilize aspects of this disclosure with other conductive structures, other electronic devices and other multilevel interconnect systems. Additionally, some embodiments may form conductive structures (e.g., contacts, lines, etc.) having high resistance and low resistance separately, rather than simultaneously.

FIGS. 1-9 illustrate cross-sectional views of various intermediate stages in formation of contacts having different resistances, in accordance with some embodiments. Referring first to FIG. 1, there is shown FinFET devices 60 formed in fin-like strips of semiconductor protrusions 58, referred to as fins, protruding from a semiconductor substrate 50. The substrate 50 illustrated in FIG. 1 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The cross-section shown in FIG. 1 is taken along a longitudinal axis of a fin 58 in a direction parallel to the direction of the current flow between the source/drain regions 54 of the FinFET devices 60. The fins, such as fin 58, may be patterned by any suitable method. For example, the fins may be patterned using one or more photolithography processes, including double-patterning or multi-patterning processes, thereby allowing patterns to be created that have, for example, pitches smaller than what is otherwise obtainable using a single, direct photolithography process. For example, in one embodiment, a spacer image transfer (SIT) double patterning technique may be used. In the SIT technique, a sacrificial layer is formed over a substrate and patterned to form mandrels using a photolithography process. Spacers are formed alongside the mandrels using a self-aligned process. The sacrificial layer is then removed, and the remaining spacers may then be used as a hard mask to pattern the fins. FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some embodiments, the STI regions 62 may include a liner, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some embodiments, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a replacement gate process flow. In a replacement gate process flow, the HKMG gate structure 68 replaces a sacrificial dummy gate structure (not shown). After forming the STI regions 62, a dummy gate dielectric layer (e.g., silicon oxide, silicon nitride, or the like) and a dummy gate layer (e.g., amorphous silicon, polycrystalline silicon, or the like) are deposited successively using suitable deposition techniques, such as CVD, plasma-enhanced CVD (PECVD), atomic layer deposition (ALD), plasma-enhanced ALD (PEALD) or the like, or by thermal oxidation of the semiconductor surface, or combinations thereof. The dummy gate material may be planarized (e.g., by CMP) and, after planarization, a hard mask layer (e.g., silicon nitride, silicon carbide, or the like) may be formed over the dummy gate layer using, for example, CVD, physical vapor deposition (PVD), PECVD, ALD, PEALD, or the like, or a combination thereof. The dummy gate structure, comprising the dummy gate dielectric, the dummy gate, and the hard mask, is then formed by patterning the hard mask and transferring that pattern to the dummy gate dielectric and dummy gate material using suitable photolithography and etching techniques (e.g., reactive ion etching (RIE)). The dummy gate structure may be formed alongside the sidewalls and tops of the fins 58 protruding above the STI 62 and extend over the surface of the STI regions 62 between the fins 58.

In some embodiments, source/drain regions 54 and spacers 72 of FinFET 60 may be formed self-aligned to the dummy gate structures. Spacers 72 may be formed after patterning the dummy gate structures. A spacer dielectric layer may be deposited using any suitable deposition technique (e.g., CVD, ALD, PVD, or the like, or combinations thereof) and may comprise one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source/drain regions 54 are semiconductor regions in direct contact with the semiconductor fin 58. In some embodiments, the source/drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source/drain regions 54 may comprise an epitaxially grown region. For example, after forming the LDD regions, the spacers 72 may be formed and, subsequently, the heavily-doped source/drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method (e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$)

of dopants may be introduced into the heavily-doped source/drain regions 54 either in situ during SEG, or by an ion implantation process performed after the SEG, or by a combination thereof.

The first interlayer dielectric ($ILD_1$ 76 in FIG. 1) is deposited to fill the spaces between dummy gate structures (not shown) and between portions of the fins 58 protruding above the STI 62. In some embodiments, a contact etch stop layer (CESL) 11 of a suitable dielectric (e.g., silicon nitride, silicon carbide, or the like, or a combination thereof) may be deposited using a suitable deposition technique (e.g., CVD, PVD, ALD, PECVD, PEALD, or the like) prior to depositing $ILD_1$ 76. A planarization process (e.g., CMP) may be performed to remove excess $ILD_1$ 76 and any remaining hard mask material from over the dummy gates to form a top surface wherein the top surface of the dummy gate material is exposed and may be substantially coplanar (within process variations) with the top surfaces of the $ILD_1$ 76 and the spacers 72. After exposing the top surface of the dummy gate structures, the dummy gate structures may be removed using one or more etching techniques (e.g., wet etching or dry etching, or a combination thereof), thereby creating recesses between respective spacers 72 within which the replacement gate structures are formed, as described below.

In FIG. 1, HKMG gate structures 68 comprising a gate dielectric layer 66 and a conductive gate layer 64 are shown occupying these recesses. The replacement gate dielectric layer 66 and the replacement conductive gate layer 64 are deposited successively to fill the recesses. The gate dielectric layer 66 may comprise one or more dielectric materials, including a high-k dielectric, in accordance with some embodiments. Examples of a high-k dielectric include an oxide or a silicate of Hf, Al, Zr, La, Mg, Ba, Ti, Pb, and combinations thereof. The gate dielectric layer 66 may be formed using any suitable deposition technique such as, CVD, remote plasma CVD (RPCVD), molecular beam deposition (MBD), atomic layer deposition (ALD), or the like.

In some embodiments, the conductive gate layer 64 may be a multilayered metal gate stack comprising a barrier layer, one or more work function layers, and a gate-fill layer formed successively on top of the gate dielectric layer 66. Example materials for a barrier layer include TiN, TaN, Ti, Ta, or the like, or a multilayered combination thereof. Example materials for a work function layer include TiN, TaN, Ru, Mo, Al, for a pMOS transistor, and Ti, Ag, TaAl, TaAlC, TiAlN, TaC, TaCN, TaSiN, Mn, Zr, for an nMOS transistor. The gate-fill layer which fills the remainder of the recess may comprise metals, such as Cu, Al, W, Co, Ru, or the like, or combinations thereof, or multi-layers thereof. The conductive gate layer 64 may be formed using CVD, RPCVD, PVD, ALD, PEALD, electroplating (ECP), electroless plating, or the like.

Excess portions of the gate layer 64 and the gate dielectric layer 66 may be removed from over the top surface of $ILD_1$ 76 using, for example a CMP process. The resulting structure, as illustrated in FIG. 1, may be a substantially coplanar surface comprising an exposed top surface of $ILD_1$ 76, spacers 72, and remaining portions of the HKMG gate layers 66 and 64 inlaid between respective spacers 72. The example HKMG gate structures 68 (seen on the top of fin 58) illustrated in the right side in FIG. 1 extends, e.g., along sidewalls of and over the portion of fin 58 protruding above the STI 62. The example HKMG gate structure 68 in the left side in FIG. 1 extends over the STI region 62, such as between adjacent fins. The top of gate 64 may be from about 10 nm to about 35 nm above the fin 58.

A second interlayer dielectric ($ILD_2$ 78 in FIG. 1) may be deposited over the $ILD_1$ 76, as illustrated in FIG. 1. In some embodiments, the insulating materials to form the $ILD_1$ 76 and the $ILD_2$ 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the $ILD_1$ 76 and the $ILD_2$ 78 may be deposited using any suitable method, such as CVD, PECVD, ALD, PEALD, FCVD, spin-on, and/or the like, or a combination thereof. In some embodiments, the $ILD_2$ layer 78 may be planarized using a planarizing process (e.g., CMP). The final thickness of $ILD_2$ 78 may be from about 5 nm to about 25 nm. Optionally, an etch stop layer may be formed over the $ILD_1$ 76 prior to forming the $ILD_2$ 78, and the $ILD_2$ 78 may be formed over the etch stop layer.

The $ILD_1$ 76 and the $ILD_2$ 78 are collectively referred to as the lower interlayer dielectric ($ILD_L$) 70, in accordance with some embodiments. As illustrated in FIG. 1, electrical connections to the source/drain regions 54 of the FinFETs 60 may be made by forming source/drain contact plugs 74 extending through the dielectric layers of $ILD_L$ 70 and CESL 11 over the semiconductor fin 58. In some embodiments, the source/drain contact plugs 74 may be inlaid in $ILD_L$ 70 and CESL 11 by patterning source/drain contact plug openings (not shown) extending through the dielectric layers of $ILD_L$ 70 and CESL 11 using suitable photolithography and etching techniques, filling the openings with conductive materials, and removing excess conductive material from the surface by a suitable etch-back technique, as described in greater detail below. It is understood that electrical connections to other device electrodes may be formed simultaneously using the same processing steps.

The openings for source/drain contact plugs may be formed by first forming a patterned masking layer such as, a patterned photoresist layer (not shown) to expose a portion of the surface of $ILD_L$ 70 at locations where the source/drain contact plugs 74 would be subsequently formed. An etch process may then be used to selectively remove $ILD_L$ 70 and CESL 11 from the region not covered by the patterned mask. In some embodiments, the etch process may be performed in two successive stages. In the first stage, an anisotropic etch process (e.g., anisotropic RIE) may be used to remove the $ILD_L$ 70 selectively (selective to the CESL 11) to expose portions of the CESL 11. During the second stage of the etch process, the etchants may be switched to selectively remove the CESL 11 (selective to the semiconductor below the CESL 11) to expose portions of the source/drain regions 54. Other etching methods may be used.

In some embodiments, a conformally deposited conductive liner (not shown) may be formed in the openings for the source/drain contact plugs 74. The conductive liner comprises barrier metals used to reduce out-diffusion of the conductive fill material of source/drain contact plugs 74 into the surrounding dielectric materials and, in some embodiments, to improve the adhesion of the conductive fill material deposited in a subsequent process step used to form the conductive source/drain contact plugs 74. In some embodiments, the liner may comprise two barrier metal layers. The first barrier metal comes in contact with the semiconductor material in the source/drain regions 54 and may be subsequently chemically reacted with the heavily-doped semiconductor in the source/drain regions 54 to form a metal-silicide region (not shown) that forms a low resistance ohmic contact with the semiconductor. For example, if the heavily-doped semiconductor in the source/drain regions 54 is Si or $Si_xGe_{1-x}$, then the first barrier metal may comprise a metal such as Ti, Ni, Pt, Co, other suitable metals, or their alloys, which reacts with Si or $Si_xGe_{1-x}$ to form a conductive metal-silicide. The second barrier metal layer of the conductive liner may additionally include other metals (e.g., TiN, TaN, Ta, or other suitable metals, or their alloys). A conductive fill material (e.g., W, Ru, Co, Ni, Al, Cu, alloys of these, combinations thereof, and the like) may be deposited over the conductive liner layer to fill the source/drain contact plug openings, using any acceptable deposition technique (e.g., CVD, ALD, PEALD, PECVD, PVD, ECP, electroless plating, or the like, or any combination thereof). Next, a planarization process (e.g., a metal CMP) may be used to remove excess portions of all the conductive materials from over the surface of the $ILD_2$ 78. The resulting conductive plugs embedded in $ILD_L$ 70 are the source/drain contact plugs 74 illustrated in FIG. 1.

As explained below, the source/drain contact plugs 74 form the first of two vertical conductive features that provide a conductive path between a source/drain electrode 54 and a subsequently formed $M_1$ line. The second vertical conductive feature of a source/drain contact, referred to as a source/drain contact via, is formed vertically adjacent to the respective source/drain contact plug 74, and is inlaid in an upper interlayer dielectric ($ILD_U$) above $ILD_L$ 70 as described in greater detail below. The source/drain contact via may have either a high electrical resistance or a low electrical resistance, depending on whether it is located within a region exposed to a pre-treatment process.

Figure 2:
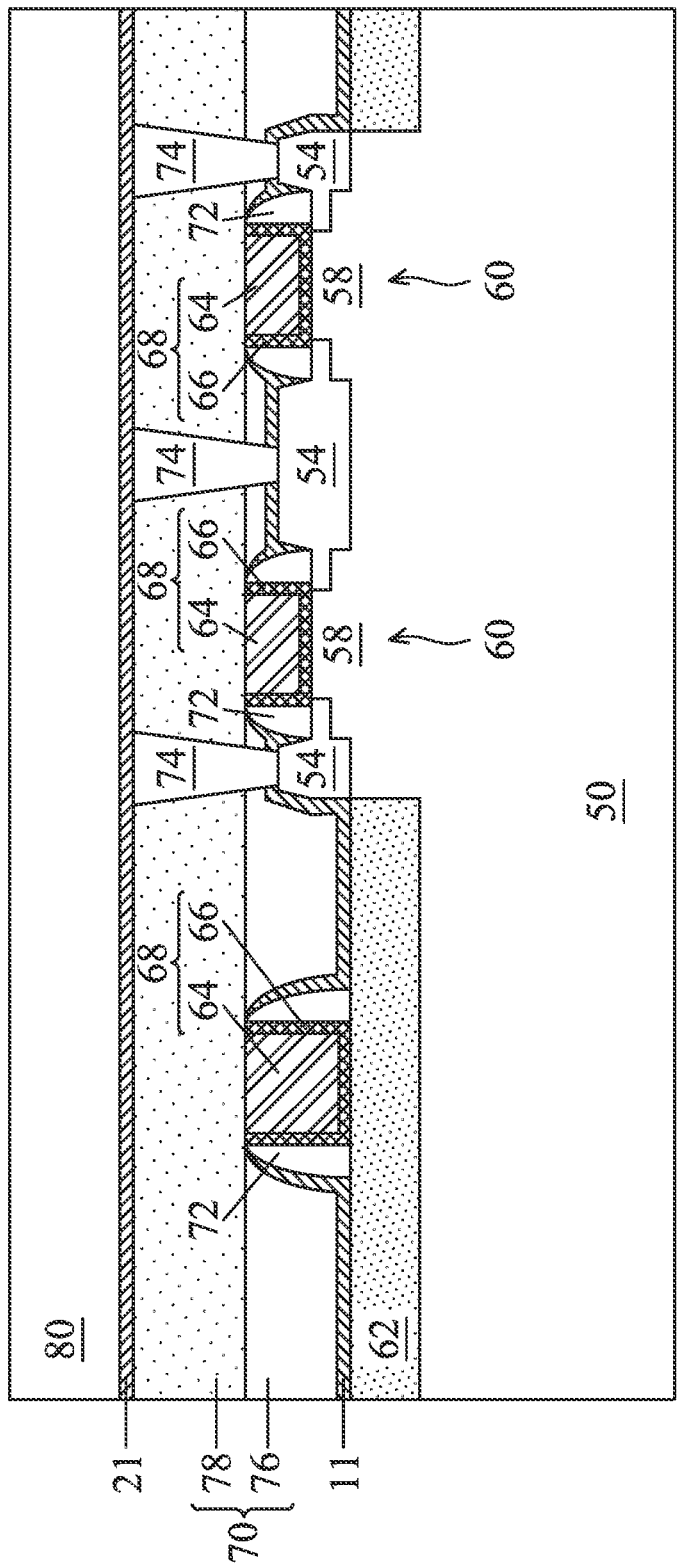

Referring now to FIG. 2, one or more insulating layers may be formed successively over the planarized top surface. The planarized top surface comprises an insulating portion (e.g., $ILD_2$ 78) and a conductive portion (e.g., source/drain contact plugs 74). In some embodiments, an etch stop layer (ESL) 21 may be deposited over the surface and $ILD_U$ 80 formed over ESL 21. The ESL 21 may comprise one or more insulators, such as SiN, SiCN, SiOC, AlN, AlO, combinations thereof, or the like, of thickness of about 8 nm to about 20 nm, formed using appropriate deposition techniques, such as ALD, PEALD, PECVD, and/or the like, or a combination thereof. The materials and processes used to form $ILD_U$ 80 may be similar to those described in the context of forming the dielectric layers of $ILD_L$ 70.

Figure 3:
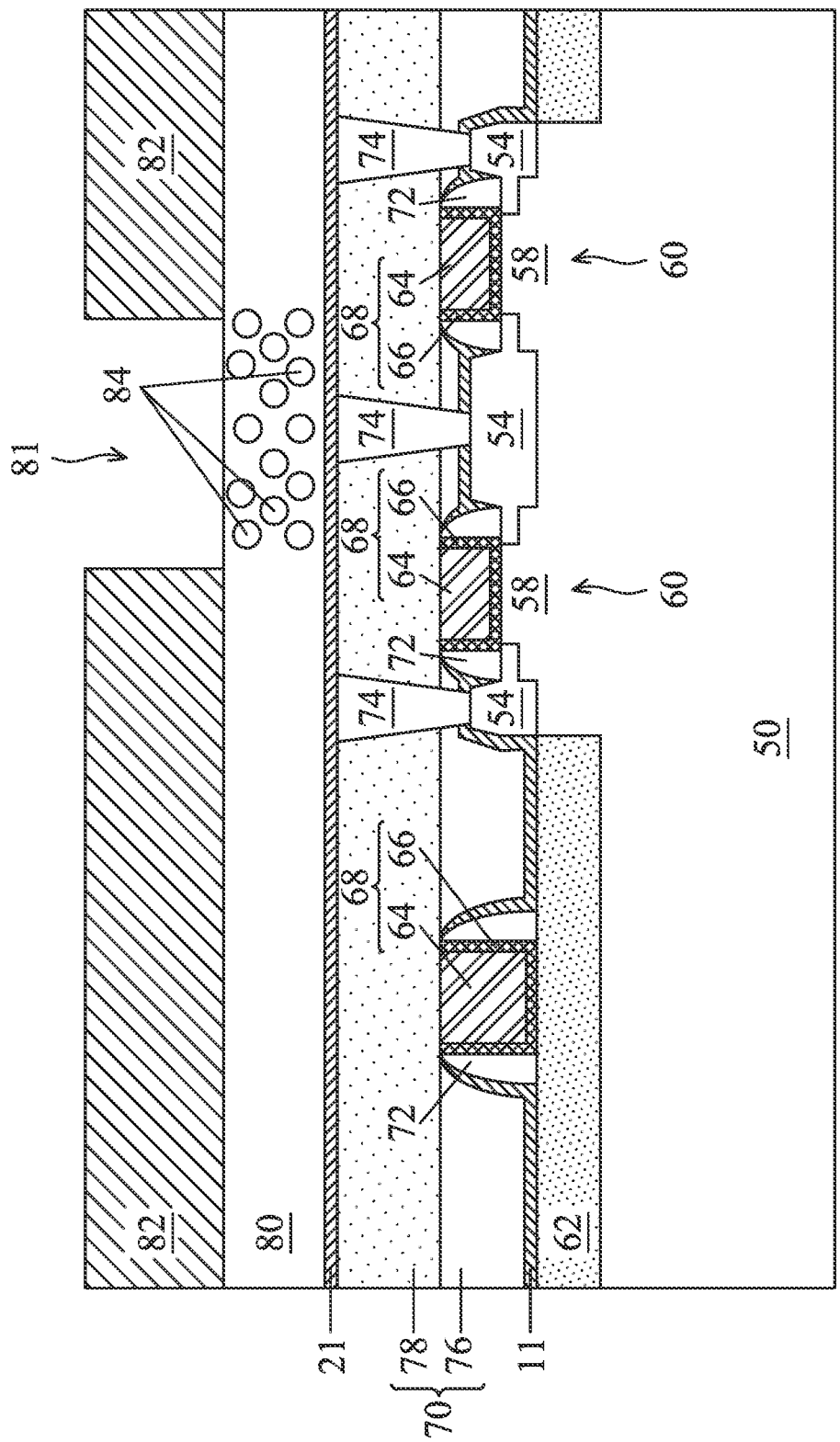

Referring now to FIG. 3, a patterned mask 82 (e.g., a patterned photoresist layer) having openings 81 is formed over the $ILD_U$ in accordance with some embodiments. As discussed in greater detail below, a high-resistance source/drain contact via will be formed in a region where the $ILD_U$ has been exposed to a pre-treatment process step performed prior to depositing the conductive material for source/drain contact vias. The pre-treatment process incorporates impurities in $ILD_U$ 80 prior to depositing the conductive material for source/drain contact vias, wherein the impurities prevent the conductive material from transitioning from a high-resistance state to a low-resistance state. As illustrated in FIG. 3, in some embodiments, the patterned mask 82 is formed over $ILD_U$ 80 to expose the regions wherein high-resistance source/drain contact vias may be formed during subsequent processing. In FIG. 3, impurities 84 have been incorporated into the exposed regions of $ILD_U$ 80 using, for example, an ion implantation technique. The impurity species incorporated into $ILD_U$ 80 may include, for example, B, C, or Ge ions, or the like. The total dose may be from about $10^{14}$ ions/cm$^2$ to about $5\times10^{15}$ ions/cm$^2$, implanted at energies of about 20 keV to about 55 keV. After the ion implantation process is complete, the patterned mask 82 may be removed, for example, by ashing the photoresist material in oxygen plasma.

Figure 4:
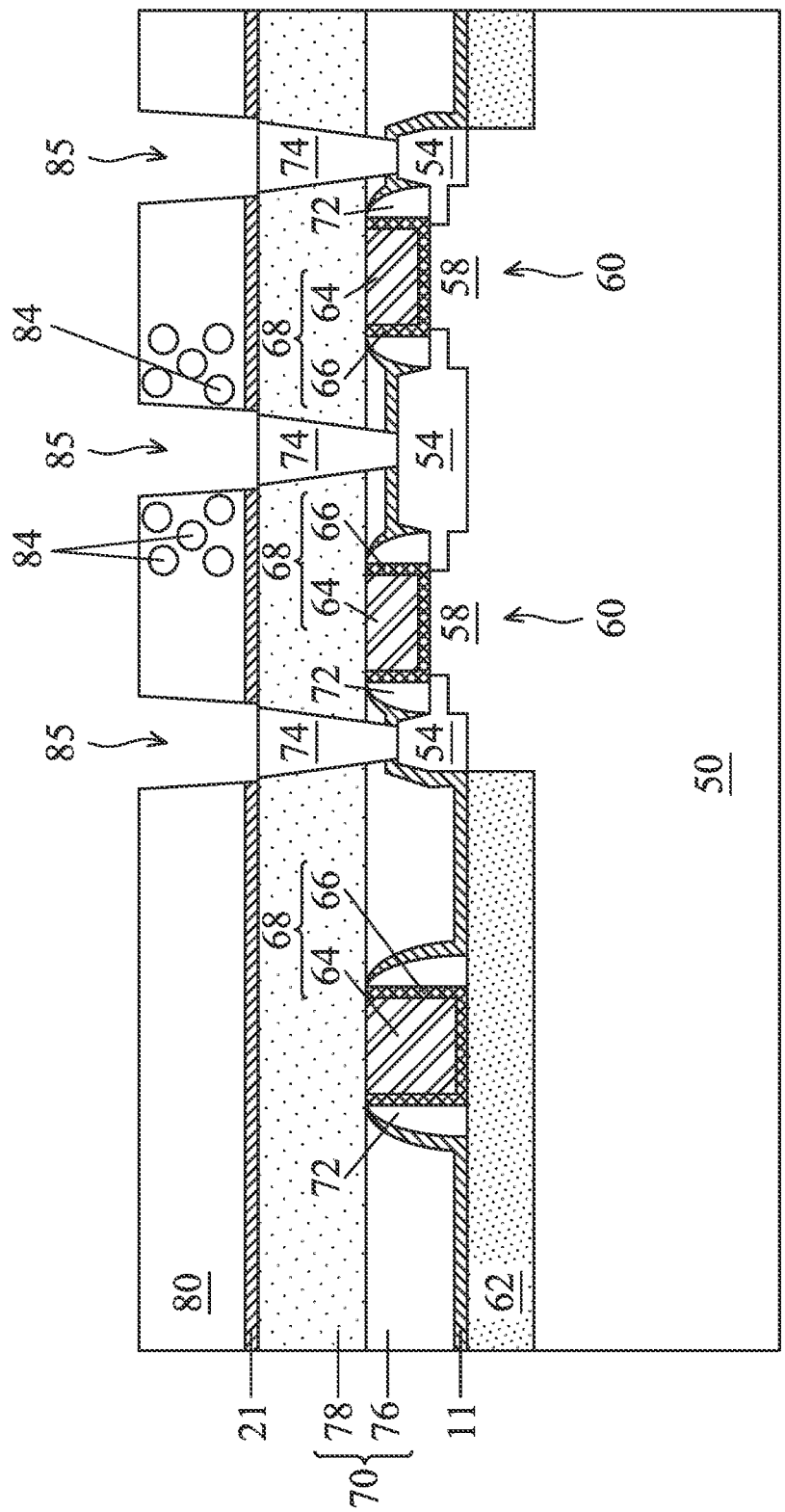

FIG. 4 illustrates contact-via openings 85 extending through $ILD_U$ 80 and ESL 21 to expose the top surfaces of contact plugs 74. The dielectric layers of $ILD_U$ 80 and ESL 21 may be patterned to form the contact-via openings 85 over contact plugs 74 using, for example, appropriate photolithography and etching (e.g., anisotropic RIE techniques). The patterned mask (not shown) used to etch the source/drain contact-via openings 85 may be designed to form the openings for high-resistance source/drain contact vias within the pre-treated portion of $ILD_U$ 80. As illustrated in FIG. 4, the sidewalls of contact-via openings 85 are in the pre-treated region of $ILD_U$ 80.

Figure 5:
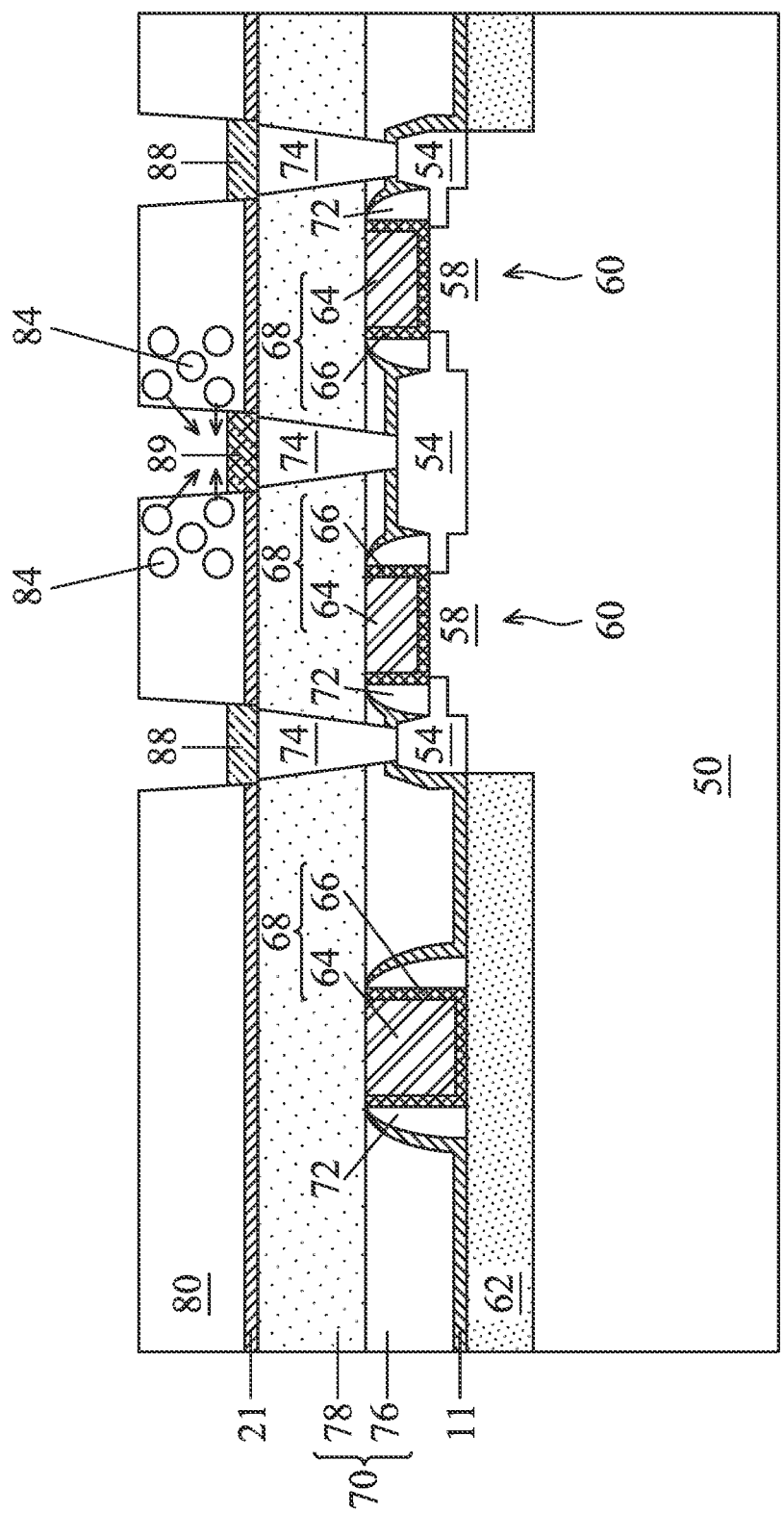
Figure 6:
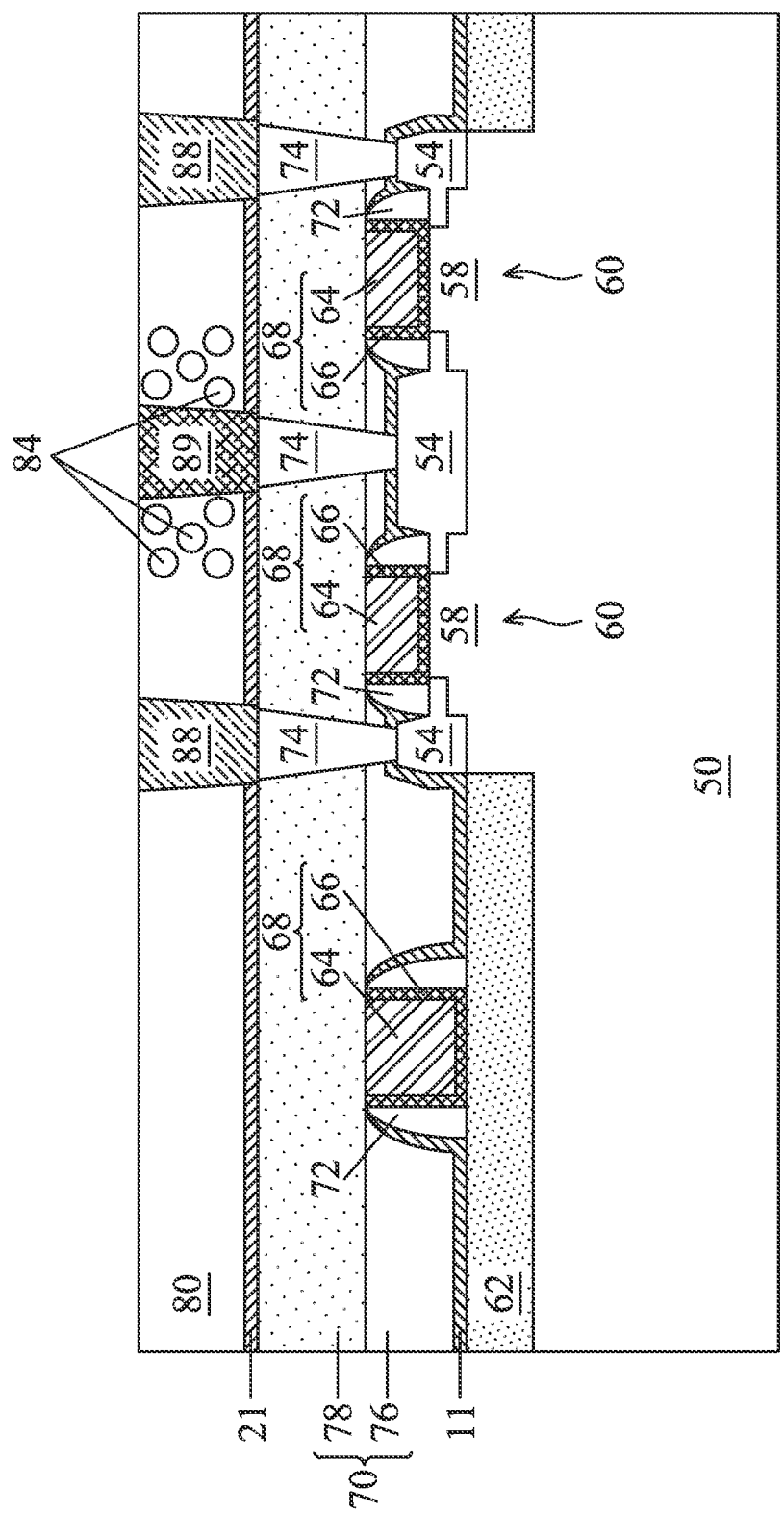

FIGS. 5 and 6 illustrate the deposition and planarization (if necessary) of conductive material that may be performed to form conductive elements (e.g., low-resistance source/drain contact vias 88 and high-resistance source/drain contact vias 89) simultaneously, in accordance with some embodiments. The low-resistance source/drain contact vias 88 and the high-resistance source/drain contact vias 89 are collectively referred to as the source/drain contact vias 88 and 89. In the example illustrated in FIG. 5, polycrystalline tungsten (W) may be deposited over the conductive contact plugs 74 by, for example, a selective CVD technique using $WF_6$ or $WCl_5$ as a precursor. Other similar precursor chemicals of the type $WF_x$ or $WCl_x$ may also be used. The precursor gas may be mixed with $H_2$ in a ratio of about 0.1% to about 1.5%, at a pressure of about 1 Torr to about 50 Torr, and W formed at a temperature of about 200° C. to about 400° C., by a reduction reaction: $WF_6+3\ H_2\rightarrow W+6\ HF$ or, $2\ WCl_5+5\ H_2\rightarrow 2\ W+5\ HCl$. In the embodiment illustrated in FIG. 5, the tungsten may be formed substantially selectively over the contact plugs 74 because the reaction requires hydrogen atoms (or hydrogen radicals) formed by dissociation of $H_2$ which occurs favorably on metallic surfaces relative to dielectric surfaces.

In the example illustrated in FIG. 5, the deposition reaction initially produces the β-phase of tungsten. Tungsten exists commonly in two crystalline forms: the body-centered cubic (BCC) α-phase, referred to as α-W, and the A15 cubic β-phase, referred to as β-W. The α-phase exhibits a low resistivity and is stable compared to the high-resistivity and relatively unstable β-W. As the deposition progresses, whereby the tungsten film grows to a thickness of about 5 nm to 15 nm, the β-W may convert to the stable low-resistivity α-phase of tungsten. The phase transition of β-W to α-W may also be induced by annealing the tungsten film. Although the β-phase of tungsten is not stable at typical ambient conditions experienced by integrated circuits, it may be stabilized by impurities and often co-exists with α-W. The physical presence of impurities in the tungsten film may impede or reduce the phase transition and stabilize the β-W in a metastable state. In the regions where the $ILD_U$ 80 has been exposed to the pre-treatment (illustrated in FIG. 3), the tungsten film is laterally surrounded by impurities 84 during the tungsten deposition process illustrated in FIG. 5. As illustrated in FIG. 5, some of these impurities 84 may out-diffuse during the deposition step and incorporate into the tungsten film. At the same time, outside the pre-treated regions, tungsten films may be formed substantially free of impurities. Accordingly, the phase of the tungsten in films formed in regions not exposed to the pre-treatment, changes to the low-resistivity α-W whereas in regions exposed to the pre-treatment, the impurities 84 block the phase transition and stabilizes the tungsten in the films in a metastable high-resistivity phase. The tungsten deposition may be completed after the openings in $ILD_U$ 80 are filled and an excess tungsten film is formed over the surface of $ILD_U$ 80.

FIG. 6 illustrates the tungsten film after a planarization process has been performed to remove excess materials of the tungsten film from a surface of the $ILD_U$ 80, thereby forming the low-resistance source/drain contact vias 88 and the high-resistance source/drain contact vias 89, in accordance with some embodiments. In some embodiments, a planarization technique (e.g., a metal CMP) may be performed to remove any excess conductive material on the surface of the $ILD_U$ 80 thereby forming both the low-resistance source/drain contact vias 88 and the high-resistance source/drain contact vias 89 inlaid in $ILD_U$ 80. The low-resistance source/drain contact vias 88 comprise the stable low-resistivity α-W phase, and the high-resistance source/drain contact vias 89 comprise the metastable high-ρ β-W phase (stabilized by the impurities 84). In some embodiments, the BCC unit cell of α-W has a lattice constant of about 3.15 Å and a low resistivity of about 3 μΩ·cm to about 6 μΩ·cm, and the cubic A15 unit cell of β-W phase has a lattice constant of about 5.04 Å and a relatively high resistivity of about 110 μΩ·cm to about 350 μΩ·cm.

Figure 7:
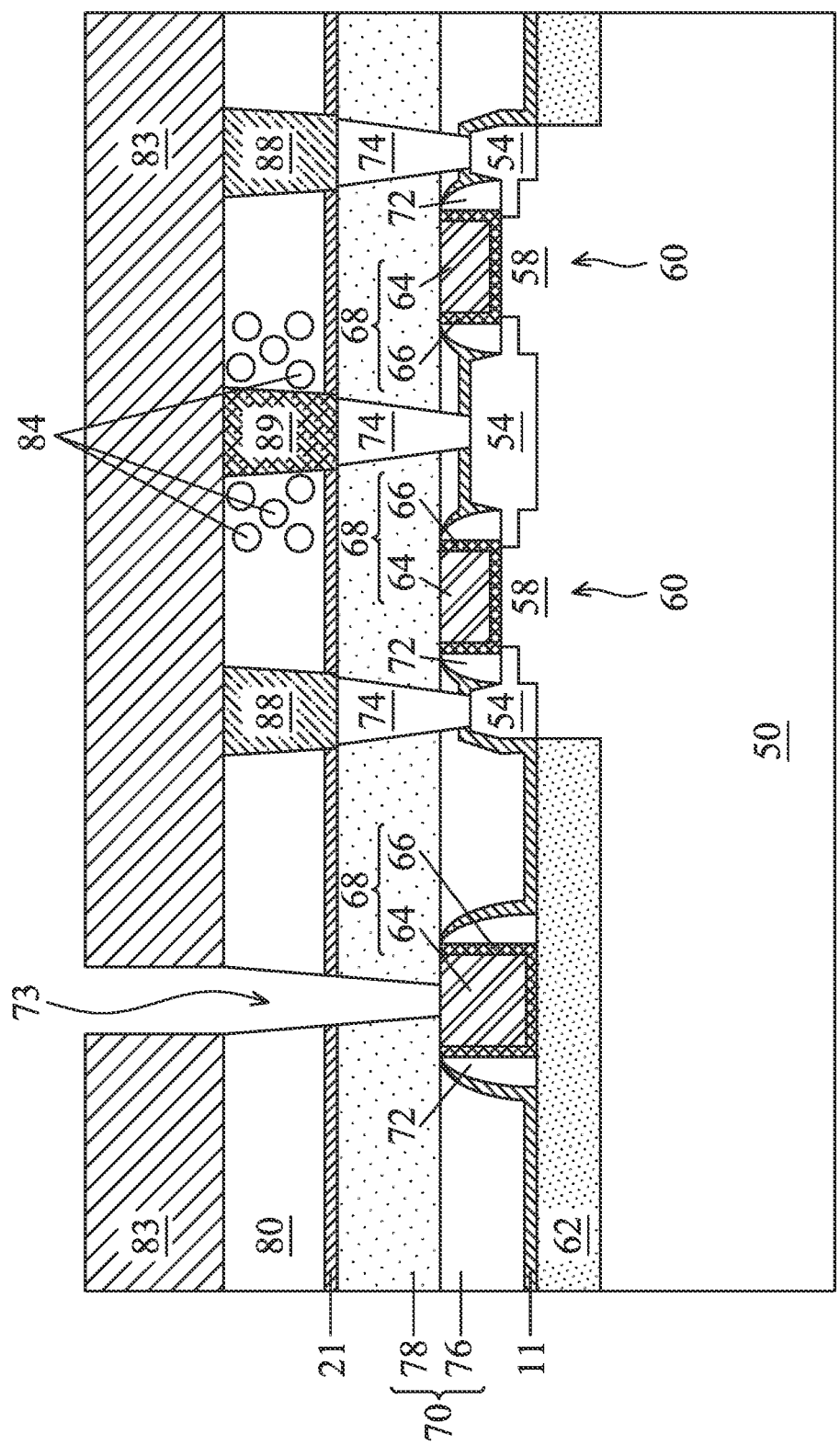
Figure 8:
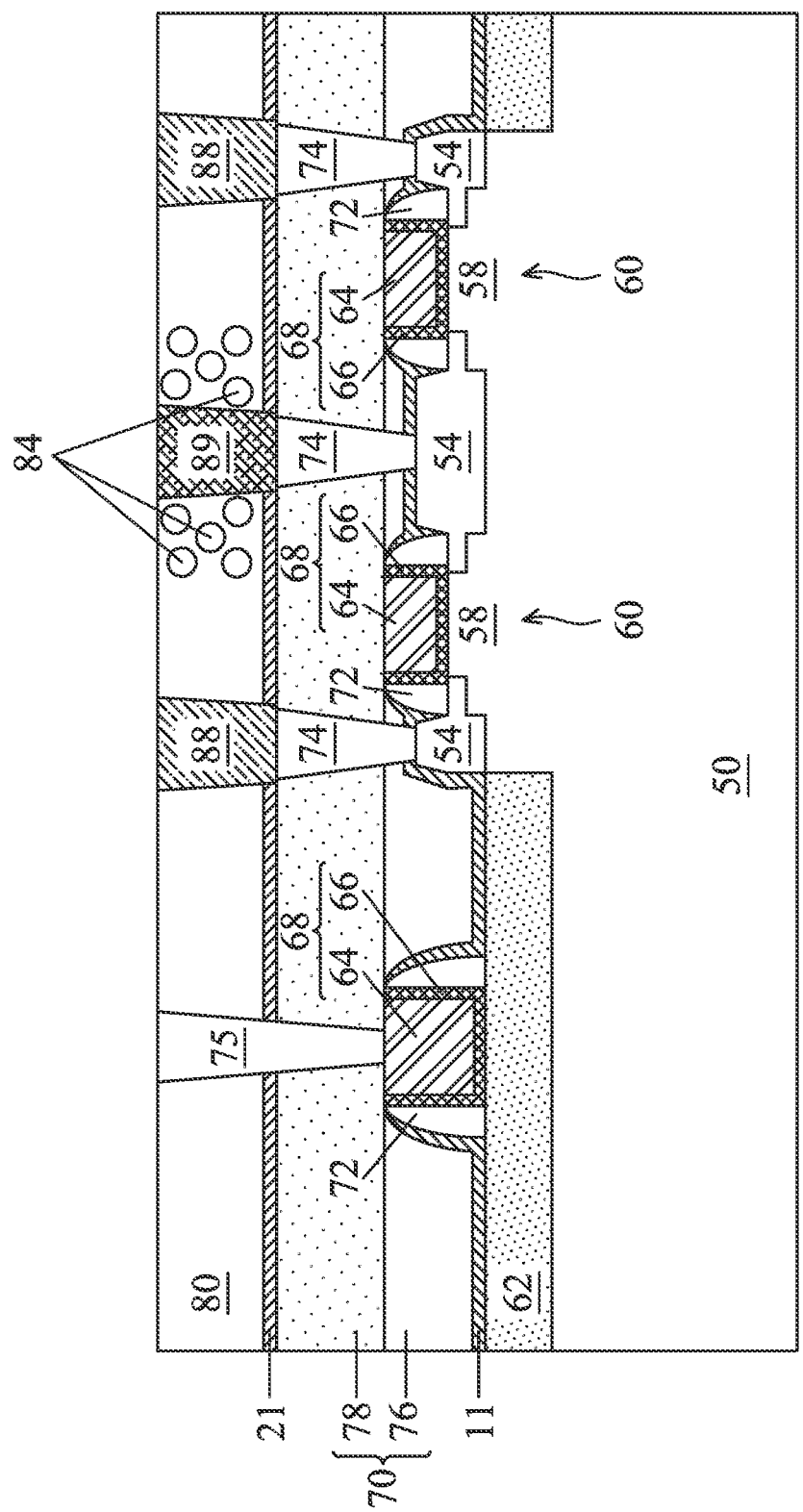

FIGS. 7 and 8 illustrate a process flow that may be used to form metal-gate contact plugs 75 connecting to the conductive gate layer 64 of the HKMG gate structure 68 formed over the STI region 62. Referring first to FIG. 7, where is shown a metal-gate contact plug opening 73 extending through the dielectric films of $ILD_U$ 80, ESL 21, and $ILD_L$ 70 to expose a portion of the top surface of the conductive gate layer 64 of the HKMG gate structure 68 formed over the STI region 62. Generally, contacts to the gate electrodes of MOSFETs, such as FinFETs 60, are formed over isolation regions, such as the STI region 62. An anisotropic RIE may be utilized to remove the dielectric materials of $ILD_U$ 80, ESL 21, and $ILD_L$ 70 over a portion of the conductive gate layer 64 exposed by a mask 83 using, for example, a patterned photoresist layer. The etching process may comprise several steps where, in each step, etchants may be switched according to the chemical properties of the various dielectric materials. For example, a three step etch sequence may be used where, in the first step, $ILD_U$ 80 may be removed using ESL 21 as a stopping layer; in the second step the etching time may be adjusted to remove ESL 21; and in the third step $ILD_L$ 70 may be removed using the conductive gate layer 64 as a stopping layer. After the etching process is complete, the mask 83 may be removed using, for example, an oxygen plasma ash technique to remove a photoresist layer.

In FIG. 8, the metal-gate contact plugs 75 are formed by filling the metal-gate contact plug openings 73 with conductive materials, and removing excess conductive material from the surface by a suitable planarization technique (e.g., a metal CMP). In some embodiments, a conformally deposited conductive liner may be formed in the metal-gate contact plug openings 73. The conductive liner comprises barrier metals (e.g., TiN, TaN, Ta, or other suitable metals, or their alloys) used to reduce out-diffusion of the conductive fill material of the metal-gate contact plugs 75 into the surrounding dielectric materials. A conductive fill material (e.g., W, Ru, Co, Ni, Al, Cu, alloys of these, combinations thereof, and the like) may be deposited over the conductive liner layer to fill the metal-gate contact plug openings 73, using any acceptable deposition technique (e.g., CVD, ALD, PEALD, PECVD, PVD, ECP, electroless plating, or the like, or any combination thereof). Next, a planarization process (e.g., a metal CMP) may be used to remove excess portions of the conductive materials from over the dielectric surface of the $ILD_U$ 80. After the planarization step is completed, a top surface of the ILDU 80, a top surface of the metal-gate contact plugs 75, and top surfaces of the dual resistance source/drain contact vias 88 and 89 are substantially coplanar with each other, within process variations. In some embodiments, the metal-gate contact plugs 75 may be formed after forming the dual resistance source/drain contact vias 88 and 89, as described above. However, it is understood that, in some other embodiments, the metal-gate contact plugs 75 may be formed before forming the dual resistance source/drain contact vias 88 and 89 using similar materials and processing techniques.

Figure 9:
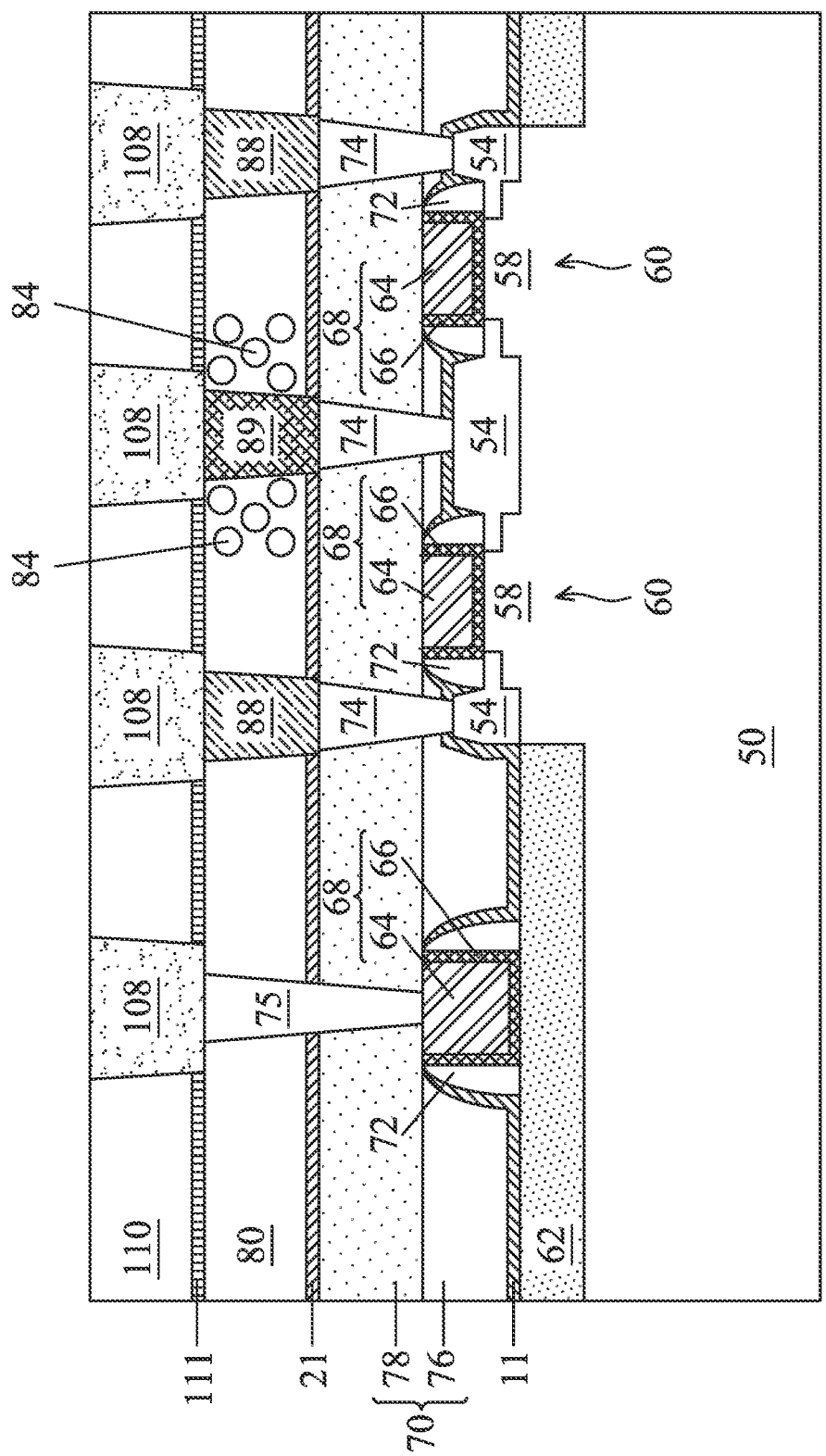

FIG. 9 illustrates metal-gate contact plugs 75, and source/drain contact vias 88 and 89 connecting to $M_1$ lines 108, in accordance with some embodiments. The metal-1 interconnect level may be formed by first depositing one or more dielectric layers, such as an ESL 111 and a first intermetal dielectric ($IMD_1$) layer 110 over the ESL 111. The ESL 111 and IMD1 110 may be formed using materials and processes similar to those used for ESL 21 and $ILD_U$ 80, described with reference to FIG. 2. Appropriate photolithography and etching techniques (e.g., anisotropic RIE employing fluoro-carbon chemistry) may be used to pattern the $IMD_1$ layer 110 to form openings for $M_1$ lines. The openings for $M_1$ lines may be longitudinal trenches extending through $IMD_1$ layer 110 to expose a top conductive surface of metal-gate contact plugs 75, and source/drain contact vias 88 and 89. The etching technique may utilize multiple steps. For example, a first main etch step may remove a portion of the dielectric material of $IMD_1$ layer 110 and stop on the ESL 111. Then, the etchants may be switched to remove dielectric material of ESL 111. Multiple masks may also be used.

One or more conductive materials may be deposited to fill the trenches forming the $M_1$ lines 108 as illustrated in FIG. 9. The openings may be first lined with a conductive diffusion-barrier material and then filled with a conductive fill material deposited over the conductive diffusion barrier liner. In some embodiments, a thin conductive seed layer may be deposited over the conductive diffusion-barrier liner to help initiate an electroplating (ECP) deposition step that fills the openings with a conductive fill material. The conductive diffusion-barrier liner may comprise one or more layers of TaN, Ta, TiN, Ti, Co, or the like, or combinations thereof. The conductive fill layer may comprise metals such as Cu, Al, W, Co, Ru, or the like, or combinations thereof, or multi-layers thereof. The conductive materials used in forming the $M_1$ lines 108 may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the $IMD_1$ 110 outside of the openings may be removed by a planarizing process (e.g., a CMP process) thereby forming a top surface of the dielectric regions of $IMD_1$ 110 that is substantially coplanar with a top surface of the conductive regions of $M_1$ 108.

As discussed herein, disclosed methods may utilize, for example, a single tungsten deposition process step to form dual resistance source/drain contact vias 88 and 89 by pre-treating a portion of $ILD_U$ 80 that includes an area designated for a high-resistance source/drain contact via 89. The pre-treatment incorporates impurities into $ILD_U$ 80 in select regions by utilizing a masking layer (e.g., a patterned photoresist layer). The impurities 84, used in forming the high-resistance source/drain contact via 89 illustrated in FIGS. 6-9, were implanted into $ILD_U$ 80 using a patterned photoresist mask 82 before forming contact via openings (see FIG. 3). In some other embodiments, described in greater detail below, impurity ions from a plasma are introduced into $ILD_U$ 80 after forming contact via openings by exposing the $ILD_U$ 80 to the plasma in select regions containing contact via openings unprotected by a masking layer (e.g., a patterned photoresist layer).

Figure 10:
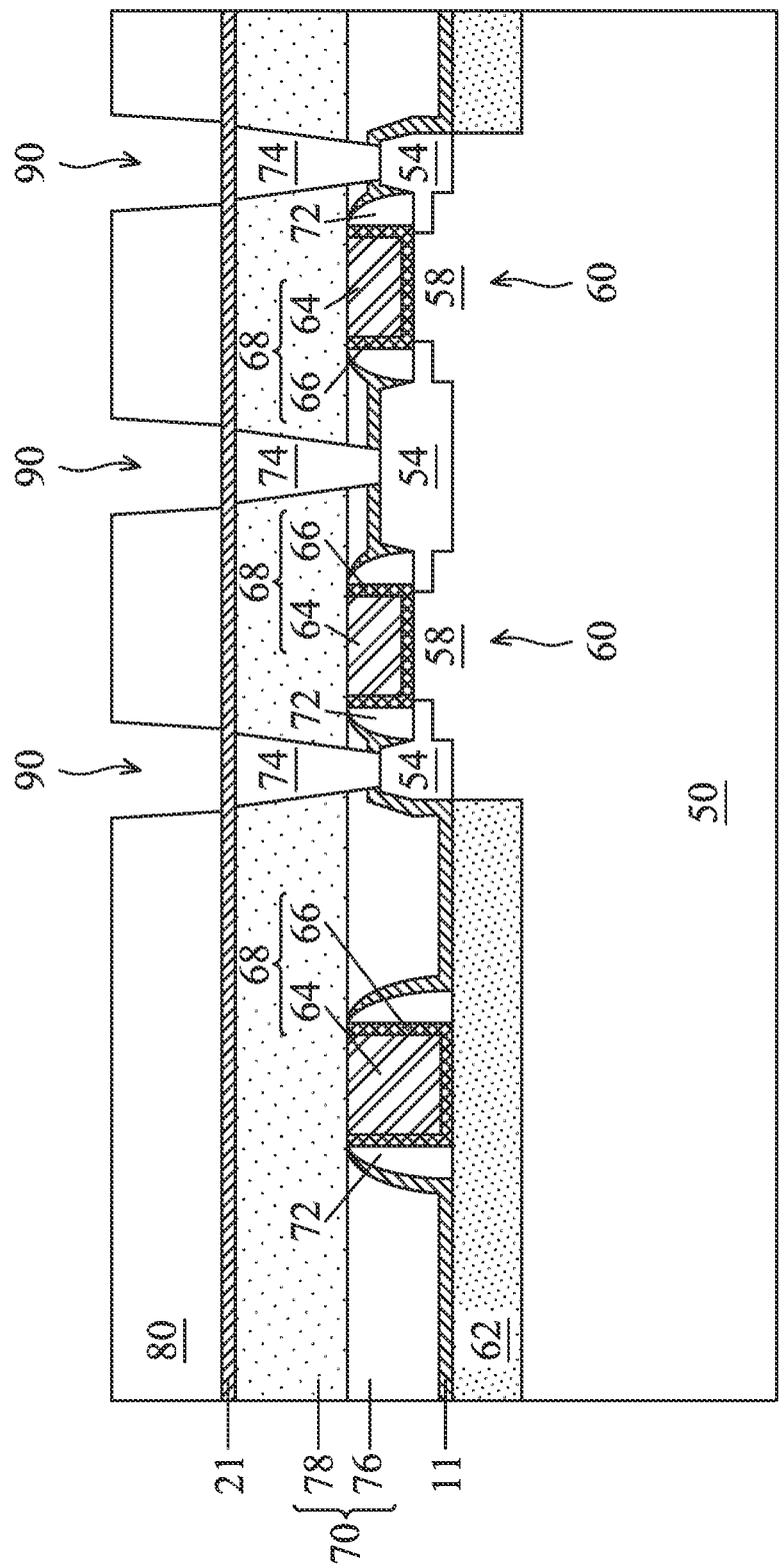
FIGS. 10 through 17 illustrate cross-sectional views of various intermediate stages of fabrication of contacts having different resistances, in accordance with some embodiments.

FIGS. 10-17 illustrate cross-sectional views of various intermediate stages of fabrication of contacts having different resistances, in accordance with another embodiment. The process described below with reference to FIGS. 10-17 assume a starting structure similar that discussed above with reference to FIG. 2. Accordingly, after performing the processes discussed above with reference to FIGS. 1 and 2, the process may continue as shown in FIGS. 10-17. Referring now to FIG. 10, the unpatterned $ILD_U$ 80 (illustrated in FIG. 2) may be patterned to form openings 90 using suitable photolithography and etching techniques. For example, a masking layer such as, a patterned photoresist layer (not shown), may be used to expose and etch a portion of $ILD_U$ 80 above the contact plugs 74. A suitable etching process (e.g., anisotropic RIE) using appropriate etchants may remove the dielectric material of $ILD_U$ 80 to expose a top surface of the ESL 21, as illustrated in FIG. 10.

Figure 11:
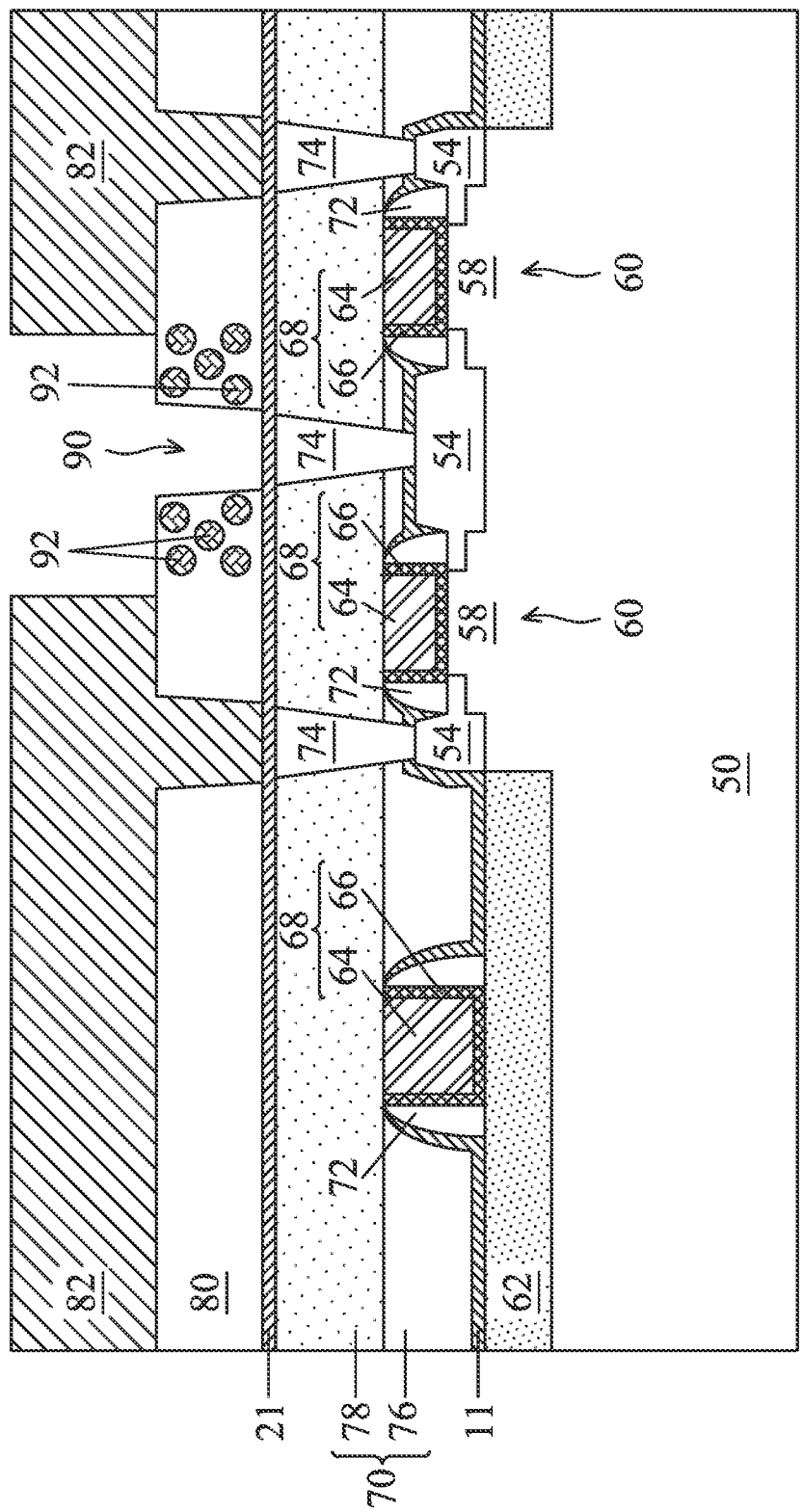

In FIG. 11, the pre-treatment process is performed wherein impurities 92 may be incorporated into a selected portion of $ILD_U$ 80 through the exposed surface and the openings 90 using a patterned mask 82 (e.g., a patterned photoresist mask) similar to the patterned mask 82 used for the pre-treatment process illustrated in FIG. 3. As illustrated in FIG. 11, the patterned mask 82 may expose the regions designated for high-resistance contact vias and protect the regions designated for low-resistance source/drain contact vias formed in subsequent processing steps. The impurities 92 are incorporated into the exposed regions of $ILD_U$ 80 (not covered by the patterned mask 82) from a direct plasma (or a remote plasma) by exposing the patterned top surface to the plasma for a time period of about 80 seconds to about 200 seconds. The total dose of the impurities 92 incorporated into $ILD_U$ 80 may be from about $10^{14}$ ions/cm$^2$ to about $5 \times 10^{15}$ ions/cm$^2$, located close to the exposed top dielectric surface and sidewalls of exposed openings 90 in $ILD_U$ 80. The plasma may comprise, for example, a $N_2$ and $H_2$ mixture with a ratio of $N_2$ to $H_2$ of about 2:3 to about 7:3 at a pressure of about 0.7 Torr to about 2.5 Torr and a temperature of about 120° C. to 200° C. The RF power used may be from about 2 kW to about 5 kW.

Figure 12:
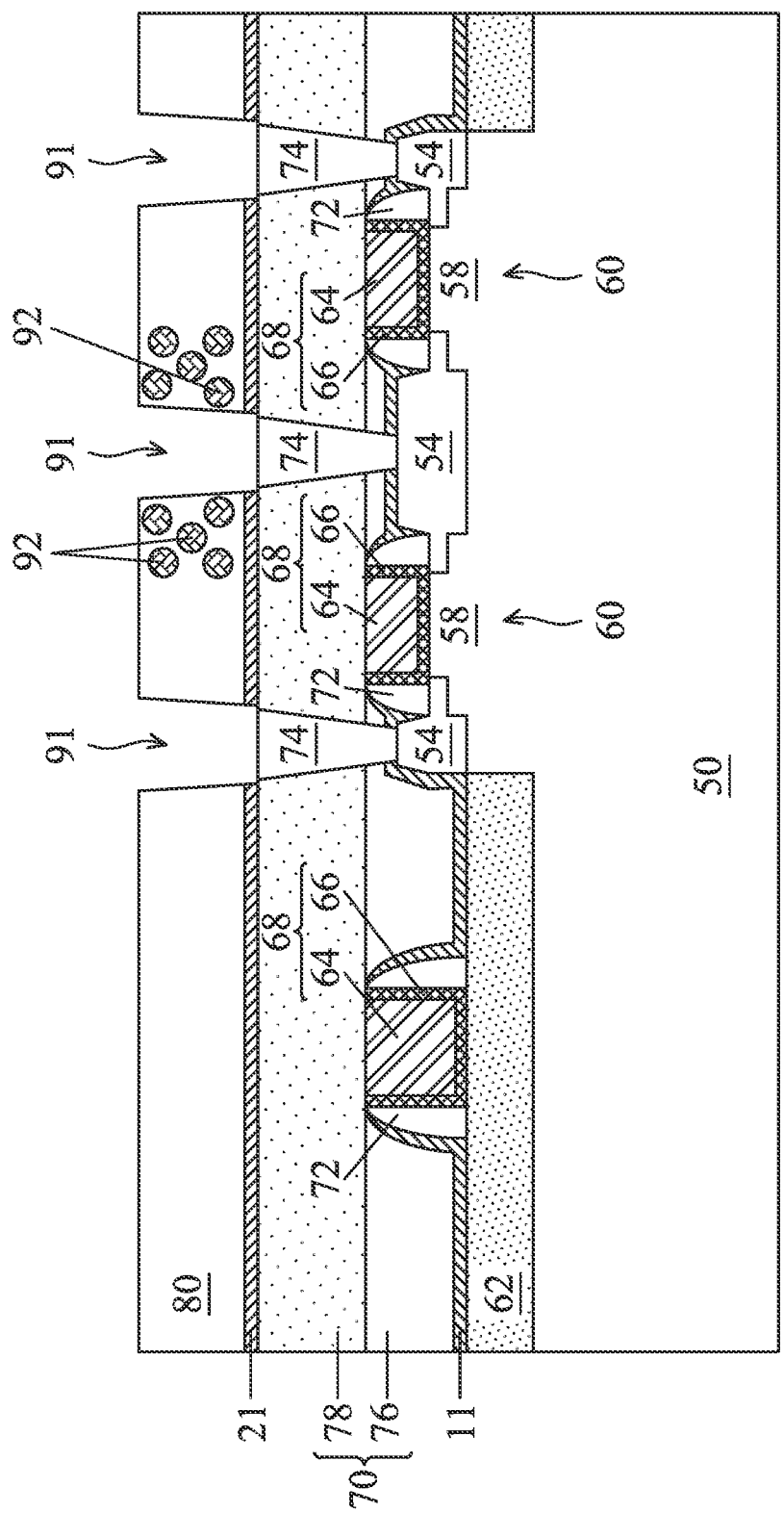

As illustrated in FIG. 12, after the pre-treatment, the patterned mask 82 may be removed and the $ILD_U$ 80 may be used as a mask to etch a portion of the exposed ESL 21 at the bottom of openings 90 (see FIG. 10). Etchants that selectively remove the dielectric material used for ESL 21 (selective to the dielectric material used for $ILD_U$ 80) may be used to extend the openings 90 (illustrated in FIG. 10) to form openings 91 thereby exposing the top surfaces of contact plugs 74 and a portion of the surface of $ILD_L$ 70.

Figure 13:
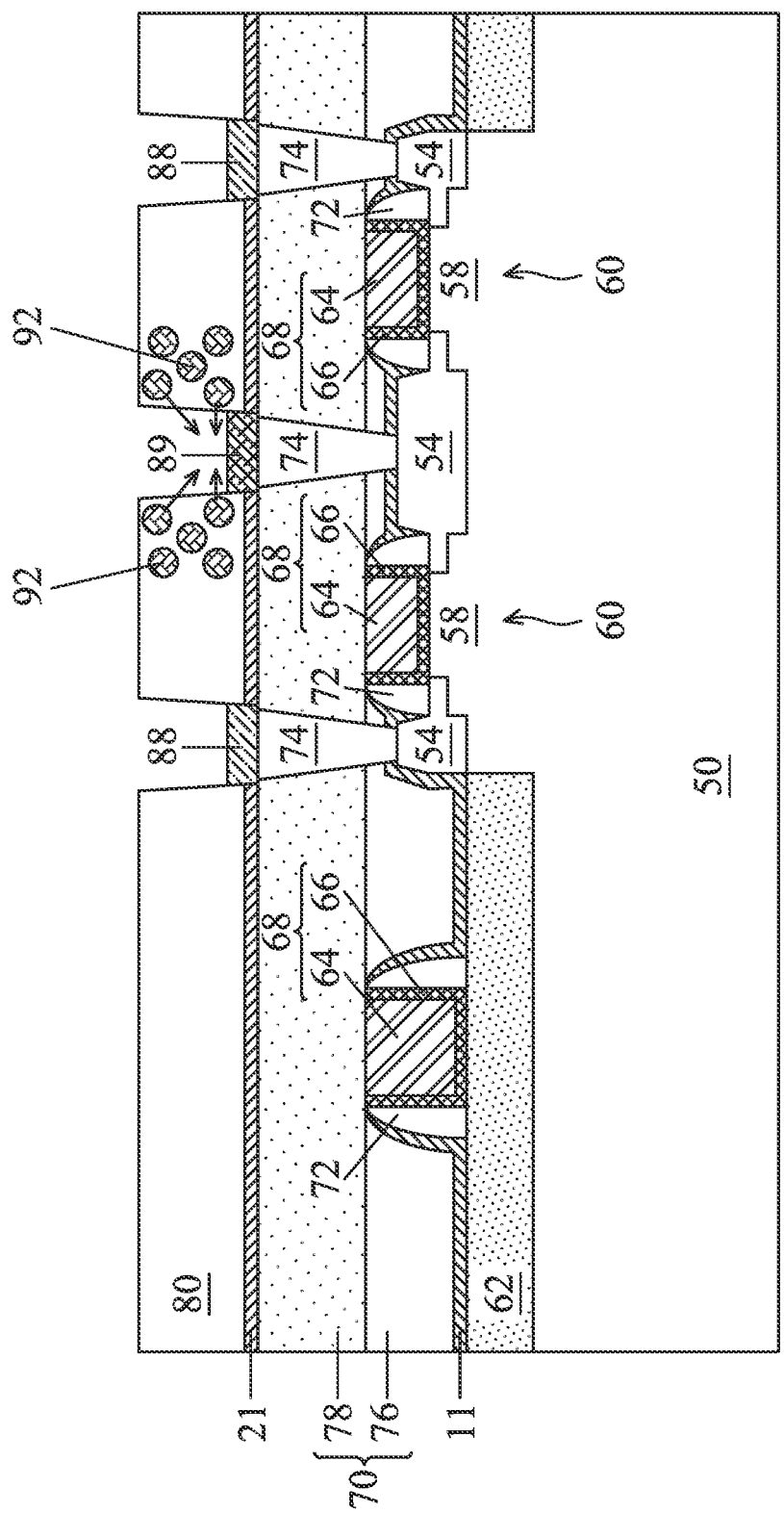
Figure 14:
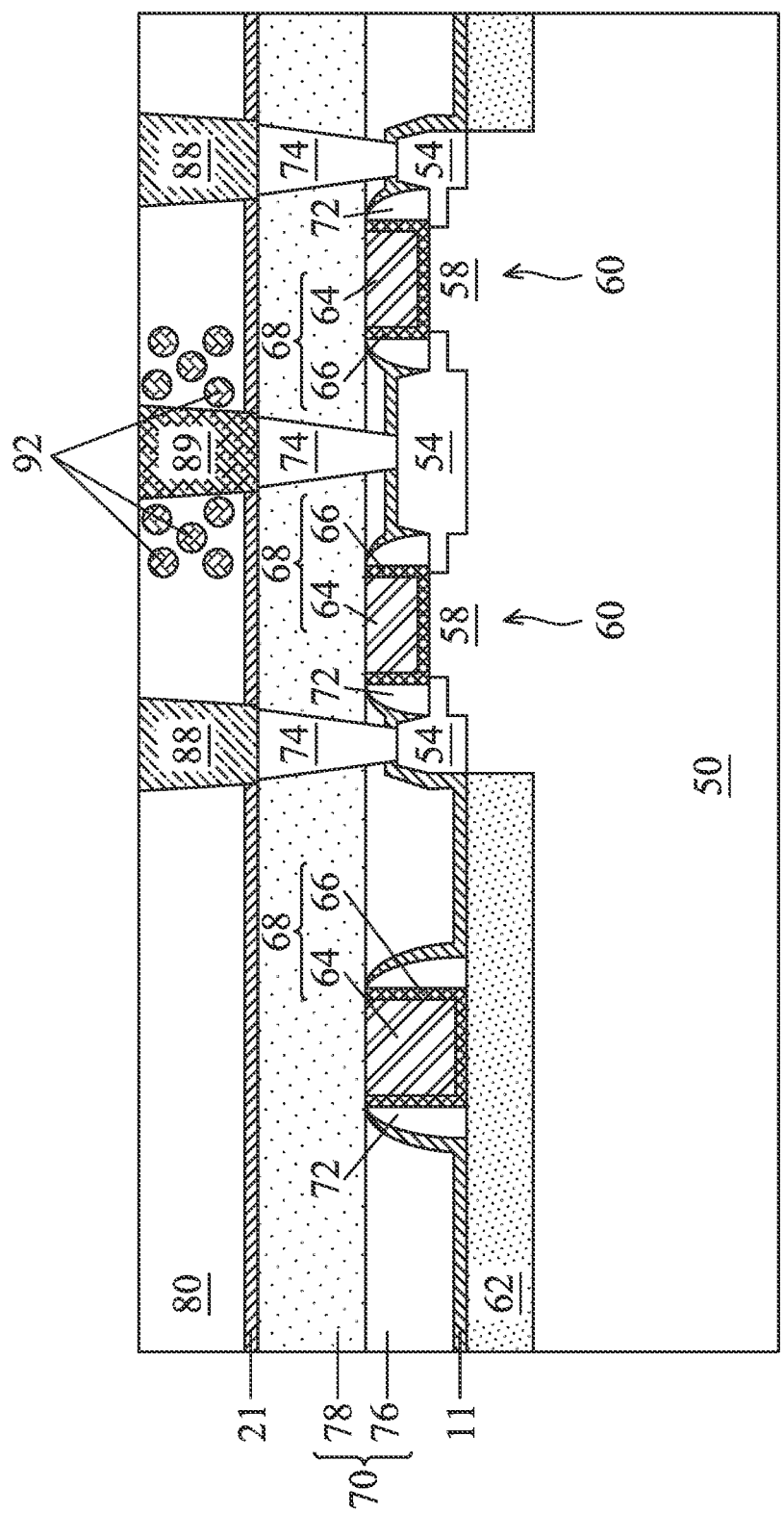

Referring now to FIGS. 13 and 14, conductive elements (e.g., the low-resistance source/drain contact vias 88 and the high-resistance source/drain contact vias 89) are inlaid in $ILD_U$ 80 may be formed using materials and processes similar to those used to form source/drain contact vias 88 and 89, as described with reference to FIGS. 5 and 6.

Figure 15:
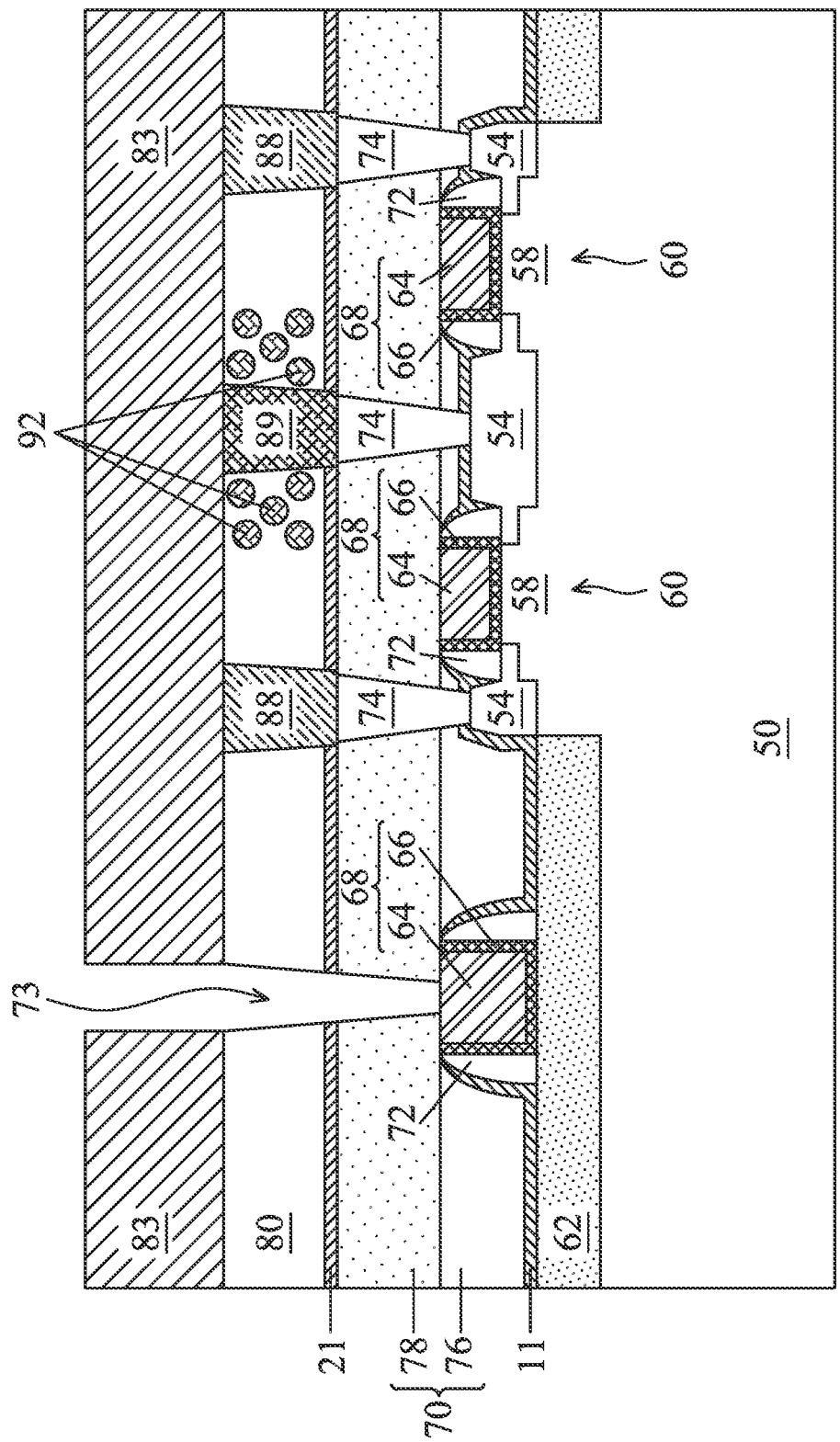
Figure 16:
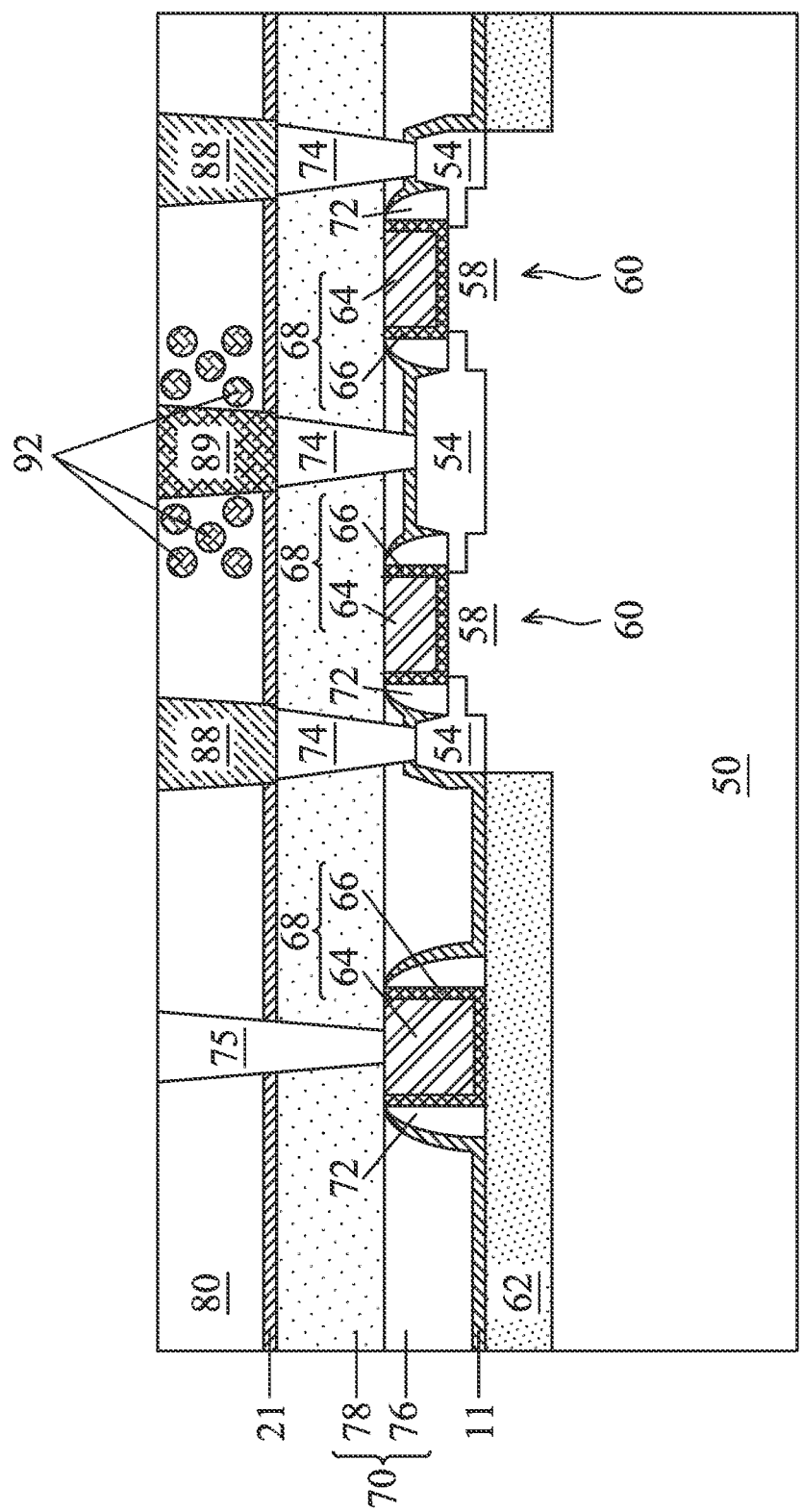
Figure 17:
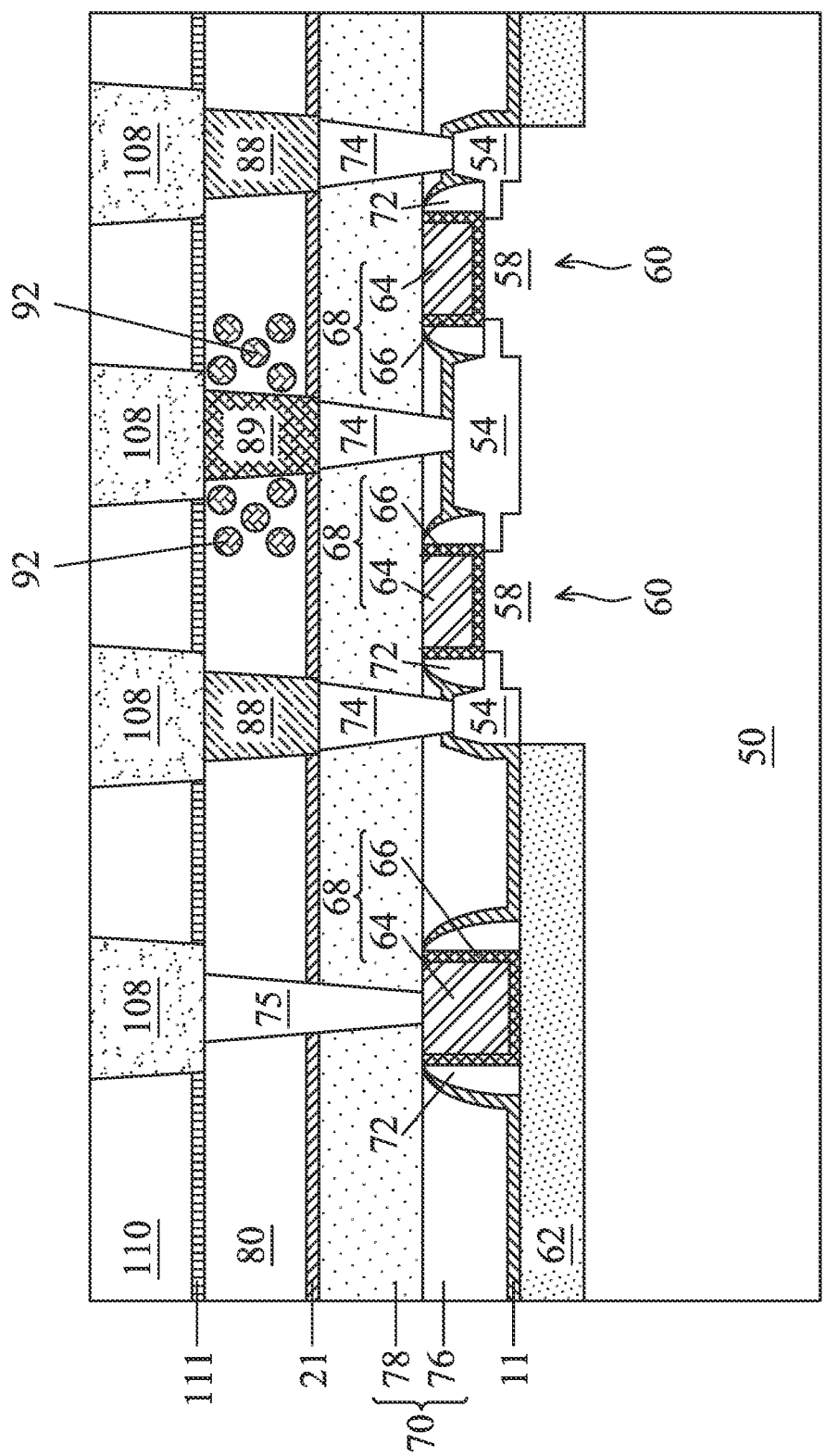

In FIG. 15 a metal-gate contact plug opening 73 is formed. FIG. 16 illustrates a metal-gate contact plug 75 connecting to the conductive gate layer 64 of the HKMG gate structure 68 formed over the STI region 62. The processes and materials used to form the metal-gate contact plug opening 73 (illustrated in FIG. 15) and the metal-gate contact plug 75 (illustrated in FIG. 16) may be similar to those described with reference to FIGS. 7 and 8. FIG. 17 illustrates metal-gate contact plugs 75, and source/drain contact vias 88 and 89 connecting to $M_1$ lines 108 inlaid in one or more dielectric layers (e.g., the ESL 111 and the IMD$_1$ layer 110 over the ESL 111), formed over the $ILD_U$ 80. The structures in FIG. 17, disposed above the $ILD_U$ 80, the metal-gate contact plugs 75, and source/drain contact vias 88 and 89, may be formed using processes and materials similar to those described with reference to FIG. 9.

The fabrication of low-resistance source/drain contact vias 88 and the high-resistance source/drain contact vias 89 illustrated above with reference to FIGS. 1 through 17 are some embodiments of methods forming dual-resistance vertically conducting connectors simultaneously with a single deposition process to form the dual-resistivity conductive materials of the contact vias 88 and 89. The high-resistance contact vias 89 may be used to construct vertically conducting resistor components in the ILD layers below the first metallization layer $M_1$. However, it is understood that similar techniques may be used to form dual-resistance vertical conductive structures at a different level, such as metallization layers $M_2$-$M_n$.

The low-resistance source/drain contact vias 88 and the high-resistance source/drain contact vias 89 illustrated above with reference to FIGS. 1 through 17 used a stable low-resistivity α-W phase and a stabilized high-resistivity β-W phase deposited simultaneously with a single deposition process by pre-treating selective locations with impurities to stabilize the high-resistivity β-W phase. The illustrations in FIGS. 1 through 17 depict process flows wherein a selective CVD technique has been used to deposit tungsten selectively over metallic surfaces (e.g., surface of source/drain contact plugs 74) and stabilize the vertically growing β-W film by incorporating impurities out-diffusing from the surrounding pre-treated dielectric material. However, it is conceivable that any other suitable deposition technique, such as ALD, PVD, or ECP, or combinations thereof, may be used.

The techniques (described above) for forming high-resistance material over a dielectric surface may be used to form laterally conducting resistor structures, such as the laterally conducting high-resistance structures 94, illustrated in FIGS. 18A through 19B.

Figure 19A:
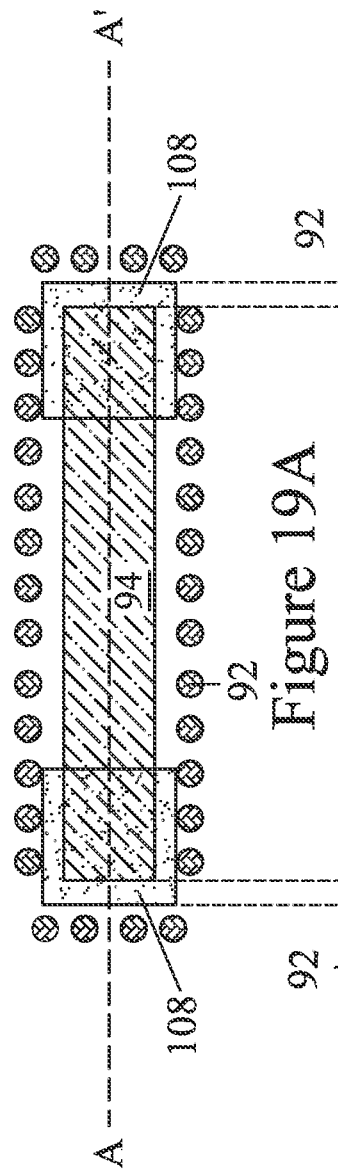
Figure 19B:
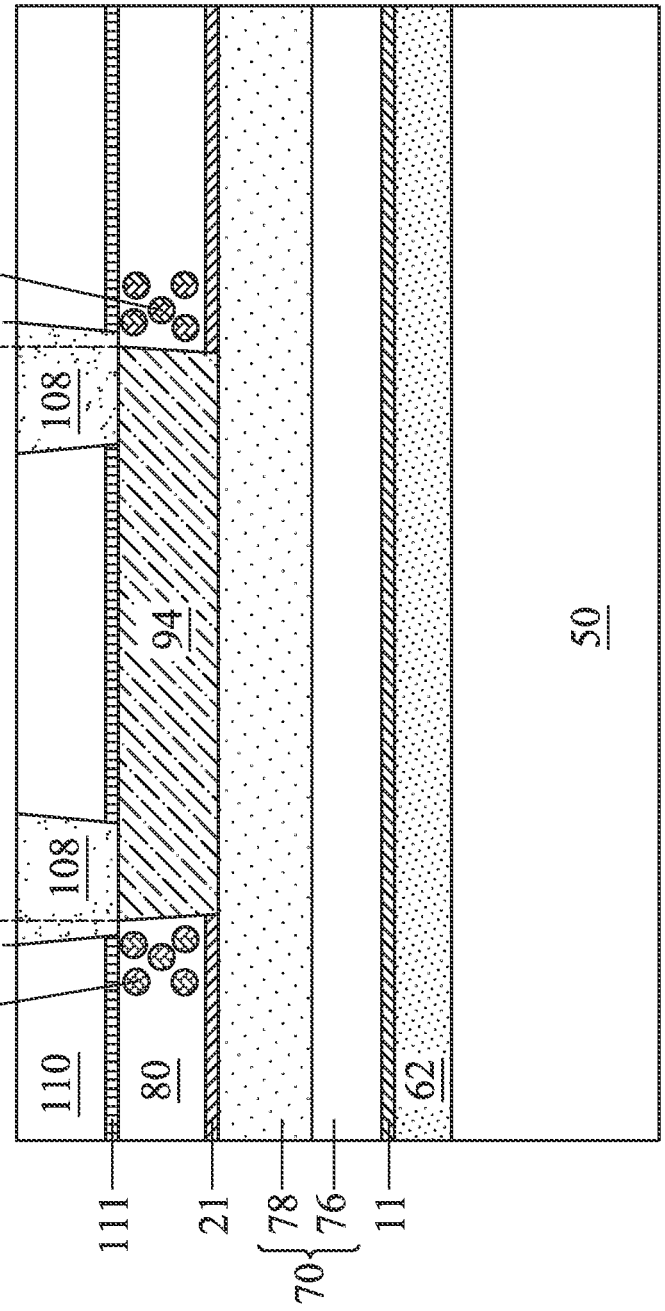

FIGS. 18A and 18B illustrate a planar schematic and a cross-sectional view of a laterally conducting high-resistance structure 94 formed using impurities 84 incorporated into the $ILD_U$ 80 by ion-implantation, similar to the method described to form vertically conducting high-resistance source/drain contact vias 89 in FIG. 9. FIGS. 19A and 19B illustrate another laterally conducting high-resistance structure 94. In FIGS. 19A and 19B, the laterally conducting high-resistance structure 94 is stabilized using impurities 92 incorporated into $ILD_U$ 80 by exposing the $ILD_U$ 80 to a plasma containing the impurity species, similar to the method described to stabilize vertically conducting high-resistance source/drain contact vias 89 in FIG. 17. The cross-sections illustrated in FIGS. 18B and 19B are taken along a longitudinal axis parallel to the current flow indicated by the dashed line A-A' in the respective plan-views illustrated in FIGS. 18A and 19A.

The laterally conducting high-resistance structures 94, illustrated in FIGS. 18A through 19B, may be used to construct laterally conducting resistor components, similar to vertically conducting resistor components constructed using the high-resistance contact vias 89, illustrated in FIGS. 9 and 17.

The embodiments described in this disclosure may be used to form two types of conductive material (e.g., a stable low-resistivity α-phase of a metal, such as tungsten, and a stabilized high-resistivity β-phase of a metal, such as tungsten) with a single deposition process thereby avoiding the cost associated with an additional deposition and an additional planarization process steps. The methods described in this disclosure include utilizing the high-resistivity β-W to form low-cost resistor components in an integrated circuit. Examples of vertically conducting resistor structures and laterally conducting resistor structures are described.

In an embodiment, a method of forming a semiconductor structure, the method includes depositing a dielectric layer; forming a mask over the dielectric layer, the mask having first opening exposing a first region of the dielectric layer; implanting impurities into the first region of the dielectric layer; forming a second opening and a third opening in the dielectric layer, the second opening being in the first region, the third opening being in a second region; and depositing a metal layer in the second opening and the third opening, wherein the metal layer in the second opening forms a first conductive element and the metal layer in the third opening forms a second conductive element. In an embodiment, the impurities include B, C, or Ge. In an embodiment, a dose of the impurities is between $10^{14}$ ions/cm$^2$ and $5\times10^{15}$ ions/cm$^2$. In an embodiment, the impurities prevent material of the metal layer from changing phases. In an embodiment, the first conductive element includes a β-phase metal and the second conductive element includes an α-phase metal. In an embodiment, implanting impurities is performed prior to forming the second opening and the third opening. In an embodiment, the first conductive element includes a laterally conducting resistor.

In an embodiment, a method of forming a semiconductor structure, the method includes depositing a dielectric layer; forming a first opening in the dielectric layer; incorporating impurities into the dielectric layer; forming a second opening in the dielectric layer; and forming a metal layer in the first opening and the second opening, wherein the impurities are incorporated along sidewalls of the first opening, wherein the metal layer in the first opening forms a first conductive element and the metal layer in the second opening forms a second conductive element. In an embodiment, forming the first opening is performed prior to incorporating the impurities. In an embodiment, the impurities reduce a transition of the metal layer from a β-phase metal to an α-phase metal in the first opening, and forming the metal layer in the second opening forms an α-phase metal. In an embodiment, the first conductive element forms a vertical resistor. In an embodiment, the first conductive element forms a lateral resistor. In an embodiment, forming the first opening and forming the second opening are performed simultaneously. In an embodiment, the method further includes forming a mask over the second opening prior to implanting the impurities; and removing the mask after implanting the impurities. In an embodiment, the impurities include B, C, or Ge at a dose of between $10^{14}$ ions/cm$^2$ and $5\times10^{15}$ ions/cm$^2$.

In an embodiment, a semiconductor structure includes a dielectric layer on a substrate; a first conductive element extending through the dielectric layer; and a second conductive element extending through the dielectric layer, wherein the first conductive element includes an α-phase metal of a first metal and the second conductive element includes a β-phase metal of the first metal, wherein the dielectric layer adjacent the second conductive element includes a higher concentration of impurities than the dielectric layer adjacent the first conductive element. In an embodiment, the first metal includes W. In an embodiment, the impurities include N, H, B, C, or Ge. In an embodiment, a dose of impurities adjacent the second conductive element is between $10^{14}$ ions/cm$^2$ and $5\times10^{15}$ ions/cm$^2$. In an embodiment, the second conductive element includes a resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a dielectric layer on a substrate;
   a first conductive element extending through the dielectric layer; and
   a second conductive element extending through the dielectric layer, wherein the first conductive element comprises an α-phase metal of a first metal and the second conductive element comprises a β-phase metal of the first metal, wherein the dielectric layer adjacent the second conductive element comprises a higher concentration of impurities than the dielectric layer adjacent the first conductive element.

2. The semiconductor structure of claim 1, wherein the first metal comprises W.

3. The semiconductor structure of claim 1, wherein the impurities comprise N, H, B, C, or Ge.

4. The semiconductor structure of claim 1, wherein a dose of impurities adjacent the second conductive element is between $10^{14}$ ions/cm$^2$ and $5\times10^{15}$ ions/cm$^2$.

5. The semiconductor structure of claim 1, wherein the second conductive element comprises a vertical resistor.

6. The semiconductor structure of claim 1, wherein the second conductive element comprises a horizontal resistor.

7. The semiconductor structure of claim 1, wherein the second conductive element comprises the impurities.

8. A semiconductor structure comprising:
   a first dielectric layer on a substrate;
   a first conductive element in the first dielectric layer, the first conductive element comprising a first metal; and
   a second conductive element in the first dielectric layer, the second conductive element comprising the first metal with first impurities, wherein the first conductive element has a lower resistance than the second conductive element.

9. The semiconductor structure of claim 8, further comprising:
   a second dielectric layer over the first dielectric layer;
   a first via in the second dielectric layer, the first via contacting a first side of the second conductive element; and a second via in the second dielectric layer, the second via contacting the first side of the second conductive element, wherein current flows from the first via to the second via through the second conductive element.

10. The semiconductor structure of claim 8, further comprising:
a second dielectric layer over the substrate, the first dielectric layer being over the second dielectric layer;
a third dielectric layer over the first dielectric layer;
a first via in the second dielectric layer, the first via contacting a first side of the second conductive element; and
a second via in the third dielectric layer, the second via contacting a second side of the second conductive element, wherein current flowing between the first via and the second via flows through the second conductive element.

11. The semiconductor structure of claim 8, wherein the first impurities comprise boron, carbon, or germanium.

12. The semiconductor structure of claim 8, wherein the first conductive element comprises an α-phase metal of the first metal, wherein the second conductive element comprises a β-phase metal of the first metal.

13. The semiconductor structure of claim 8, wherein the first metal is tungsten.

14. The semiconductor structure of claim 8, wherein the first dielectric layer adjacent the second conductive element comprises the first impurities.

15. The semiconductor structure of claim 14, wherein a dose of impurities adjacent the second conductive element is between $10^{14}$ ions/cm$^2$ and $5\times10^{15}$ ions/cm$^2$.

16. A semiconductor structure comprising:
a first dielectric layer on a substrate;
a first conductive element extending through the first dielectric layer, the first conductive element comprising a first metal with first impurities, wherein the first dielectric layer adjacent the first conductive element comprises a first dielectric material with the first impurities; and
a second conductive element extending through the first dielectric layer, the second conductive element comprising the first metal, wherein the second conductive element and the first dielectric layer adjacent the second conductive element are substantially free of the first impurities.

17. The semiconductor structure of claim 16, wherein the first impurities comprise boron, carbon, or germanium.

18. The semiconductor structure of claim 16, wherein the second conductive element is an α-phase metal with a resistivity in a range between 3 μΩ·cm and 6 μΩ·cm.

19. The semiconductor structure of claim 16, wherein the first conductive element is a β-phase metal with a resistivity in a range between 110 μΩ·cm and 350 μΩ·cm.

20. The semiconductor structure of claim 16, wherein the first conductive element and the second conductive element are vias to source/drain contacts.

* * * * *